(12) United States Patent
Yoshida et al.

(10) Patent No.: US 8,382,417 B2
(45) Date of Patent: Feb. 26, 2013

(54) ARTICLE TRANSPORT FACILITY

(75) Inventors: Mitsuru Yoshida, Higashiomi (JP); Yoshitaka Inui, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 837 days.

(21) Appl. No.: 11/983,801

(22) Filed: Nov. 9, 2007

(65) Prior Publication Data

US 2008/0138186 A1 Jun. 12, 2008

(30) Foreign Application Priority Data

Nov. 14, 2006 (JP) ................................ 2006-308081

(51) Int. Cl.
*B65H 1/00* (2006.01)

(52) U.S. Cl. ............... 414/222.04; 414/267; 414/626

(58) Field of Classification Search .............. 414/266, 414/278, 277, 282, 686, 373, 744.2, 222.01, 414/222.03, 222.04, 222.13, 225.01, 226.02, 414/281, 348, 449, 561, 572, 626, 744.1, 414/749.6, 788.2; 211/41.18; 212/98

See application file for complete search history.

(56) References Cited

U.S. PATENT DOCUMENTS

| | | | | |
|---|---|---|---|---|
| 3,450,446 A | * | 6/1969 | Vaughn Lawrence Metal. | 384/19 |
| 4,204,441 A | * | 5/1980 | Kikuchi | 82/124 |
| 4,316,494 A | * | 2/1982 | Scheurecker | 164/448 |
| 4,389,157 A | * | 6/1983 | Bernard, II et al. | 414/787 |
| 4,492,504 A | * | 1/1985 | Hainsworth | 414/273 |
| 4,678,390 A | * | 7/1987 | Bonneton et al. | 414/282 |
| 4,765,441 A | * | 8/1988 | David et al. | 187/226 |
| 4,858,290 A | * | 8/1989 | Hirose et al. | 29/35.5 |
| 4,891,998 A | * | 1/1990 | Tourville | 74/48 |
| 4,971,508 A | * | 11/1990 | JPX et al. | 414/282 |
| 5,099,981 A | * | 3/1992 | Guzzoni | 198/346.1 |
| 6,014,649 A | | 1/2000 | Kobayashi et al. | |
| 6,468,021 B1 | * | 10/2002 | Bonora et al. | 414/522 |
| 6,663,340 B1 | | 12/2003 | Zeakes et al. | |
| 6,726,429 B2 | | 4/2004 | Sackett et al. | |
| 7,578,650 B2 | * | 8/2009 | Aalund et al. | 414/806 |
| 7,780,020 B2 | * | 8/2010 | Yoshitaka | 212/332 |
| 2004/0109746 A1 | * | 6/2004 | Suzuki | 414/373 |
| 2004/0126208 A1 | * | 7/2004 | Tawyer et al. | 414/222.02 |

(Continued)

FOREIGN PATENT DOCUMENTS

DE 3714638 A1 12/1988
DE 102006036095 A1 3/2007

(Continued)

*Primary Examiner* — Saul Rodriguez
*Assistant Examiner* — Glenn Myers
(74) *Attorney, Agent, or Firm* — The Webb Law Firm

(57) ABSTRACT

An article transport facility includes an article transporting mobile body; an article support for storing an article, the article support being configured to be moved between an article transfer position and an article storage position; an operating device provided on the mobile body for shifting the article support between the article storage position and article transfer position; an operated element supported to be movable in a direction of access between a proximate position adjacent the mobile body standing still in an article transfer location and a remote position away from the mobile body standing still in the article transfer location, the operated element being operable, in the proximate position, to place the article support in the article storage position, and in the remote position, to place the article support in the article transfer position; and a guide device for guiding the operating device in a fore and aft direction to a proper operative position relative to the operated element when the operating device executes a projecting operation.

17 Claims, 17 Drawing Sheets

U.S. PATENT DOCUMENTS

| | | | |
|---|---|---|---|
| 2004/0234360 A1* | 11/2004 | Hayashi | 414/217 |
| 2005/0036877 A1* | 2/2005 | Ogawa et al. | 414/744.2 |
| 2006/0072987 A1* | 4/2006 | Hoshino | 414/277 |
| 2006/0222479 A1* | 10/2006 | Shiwaku et al. | 414/267 |
| 2007/0059131 A1* | 3/2007 | Yoshitaka | 414/217 |

FOREIGN PATENT DOCUMENTS

| | | |
|---|---|---|
| EP | 0100867 B1 | 2/1984 |
| JP | 1045213 | 2/1998 |
| JP | 20007145 A | 1/2000 |

\* cited by examiner

FIG.7

FIG.14
(A)
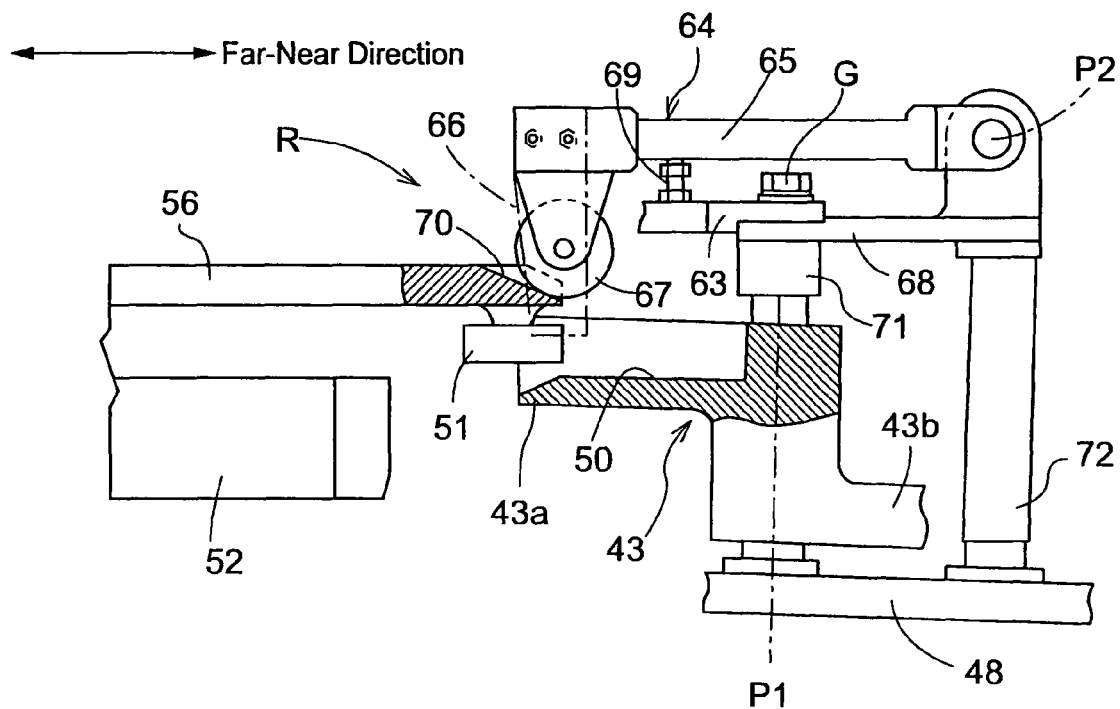
(B)
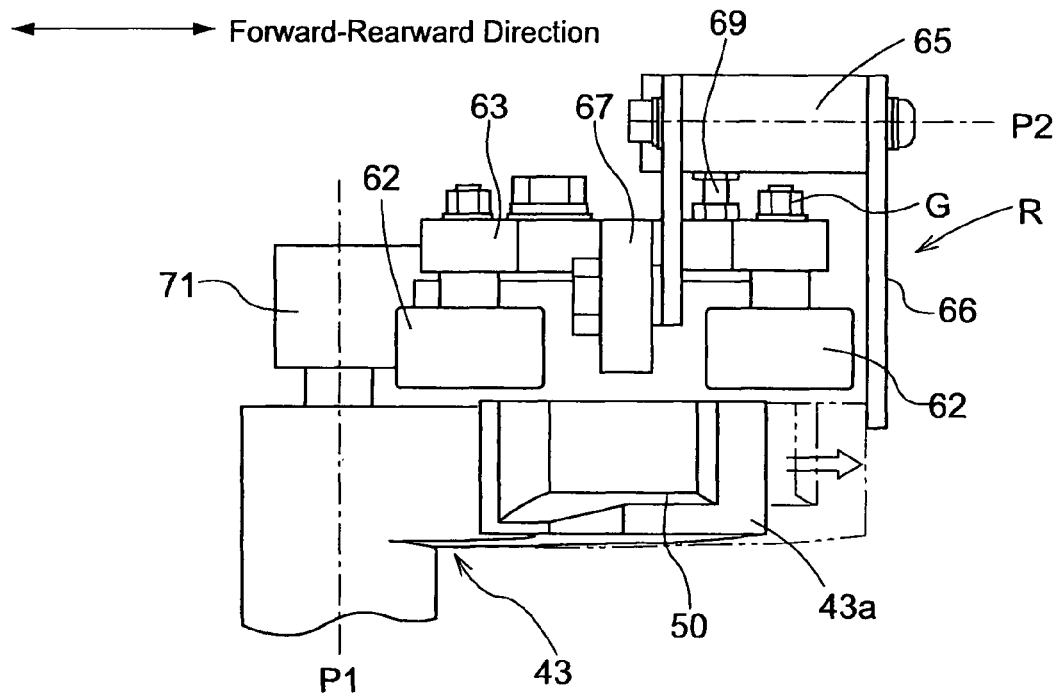

FIG.15
(A)
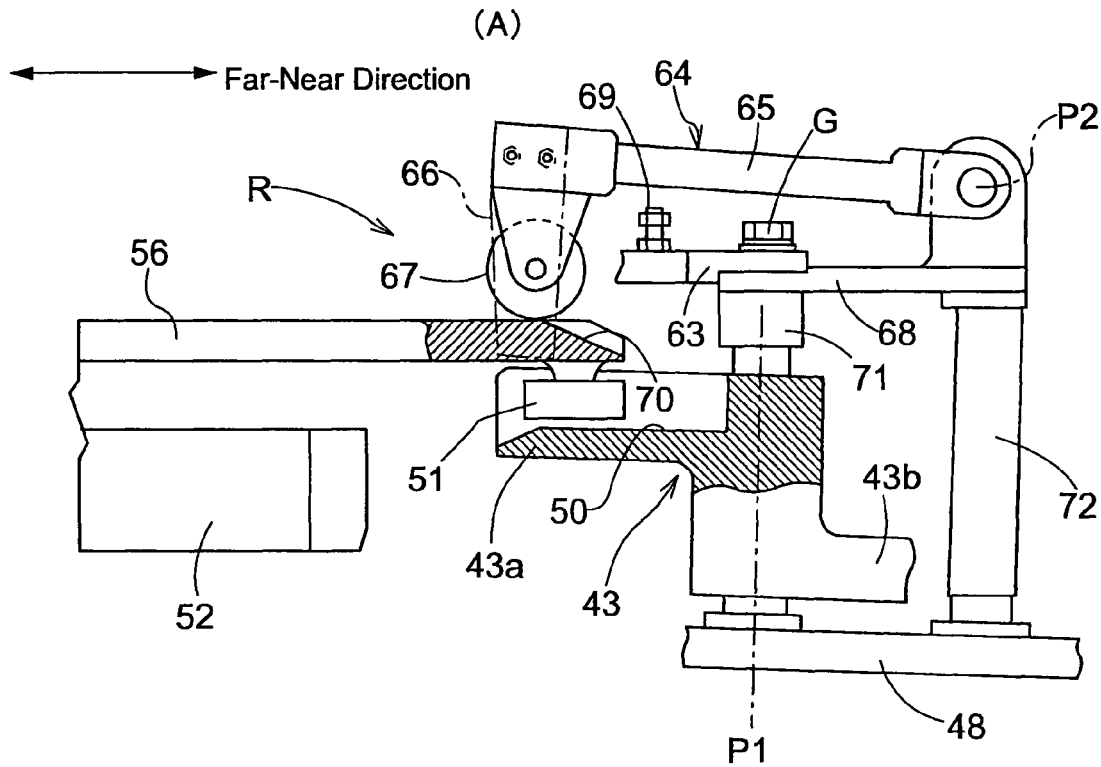
(B)
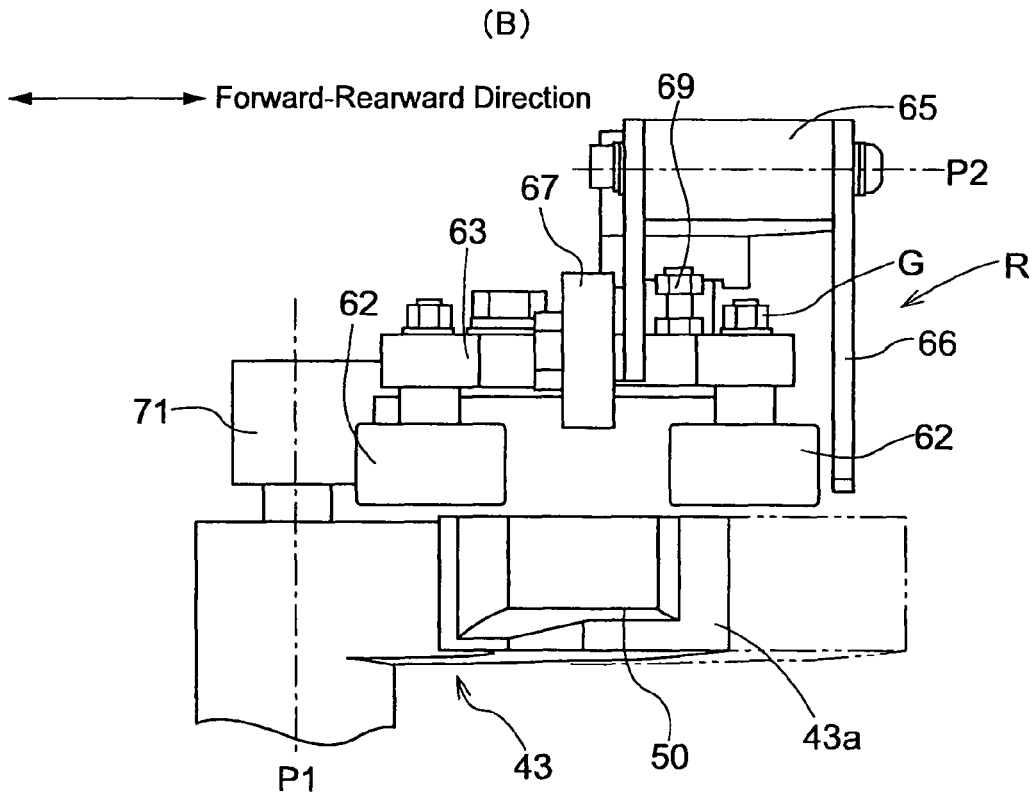

ARTICLE TRANSPORT FACILITY

BACKGROUND OF THE INVENTION

This invention relates to an article transport facility, and more particularly to an article transport facility including a mobile body movable along a path and having an article holder.

Such an article transport facility includes a plurality of article transfer stations arranged along the path. The mobile body moves along the path to transport articles between the stations, such as by receiving an article from a station or delivering an article to a station.

Article supports for article storage are provided to keep temporarily articles to be transported to the stations. The article supports are usually located in positions for article storage such as at a side of and close to the path, not to interfere with movement of the mobile body. The article supports are shifted from the article storage position to an article transfer position only when articles are transferred to or from the article holder of the mobile body. Specifically, with the mobile body stopped at an article transfer location, the article support adjacent thereto is shifted from the article storage position to an article transfer position to transfer an article between the article support and the holder of the mobile body. Subsequently, the article support is shifted from the article transfer position to the article storage position, whereby the article is stored on the article support or is passed from the article support to the mobile body.

A conventional article transport facility has a guide rail serving as the path installed on the ceiling, a link mechanism pivotable about a horizontal axis relative to the ceiling for supporting the article support to be shiftable between the article storage position and article transfer position, and a hydraulic cylinder disposed between the ceiling and the link mechanism for shifting the article support between the article storage position and article transfer position (see JP 10-45213, for example).

In order to shift each article support between the article storage position and article transfer position, the above conventional article transport facility requires, arranged at a side of and close to the path, the hydraulic cylinder for shifting the article support between the article storage position and article transfer position, in addition to the link mechanism which supports the article support to be shiftable between the article storage position and article transfer position. Consequently, an increased number of components are arranged alongside the path, thereby enlarging an installation space as well as complicating the construction.

SUMMARY OF THE INVENTION

This invention has been made having regard to the state of the art noted above, and its object is to provide an article transport facility which can shift an article support between an article storage position and an article transfer position while realizing a simplified construction.

An article transport facility according to this invention comprises:

an article transporting mobile body configured to move along a path and having an article holder;

an article support for storing an article, the article support being configured to be moved between an article transfer position for receiving an article from the mobile body standing still in an article transfer location adjacent the article support and passing the article to the article holder, and an article storage position;

operating means provided on the mobile body for shifting the article support between the article storage position and the article transfer position, the operating means having an operating member, the operating means executing a projecting operation for projecting the operating member from the mobile body in a direction of access to the mobile body standing still in the article transfer location, and a retracting operation for retracting the operating member to the mobile body in the direction of access, and the operating member being supported movable in a fore and aft direction of the mobile body standing still in the article transfer location;

an operated element supported to be movable in the direction of access between a proximate position adjacent the mobile body standing still in the article transfer location and a remote position away from the mobile body standing still in the article transfer location, the operated element being operable, in the proximate position, to place the article support in the article storage position, and in the remote position, to place the article support in the article transfer position; and guide means for guiding the operating member in the fore and aft direction to a proper operative position relative to the operated element when the operating means executes the projecting operation;

wherein the operating means is constructed to execute, when the mobile body stands still in the article transfer location, the projecting operation for causing the operating member to move the operated element from the proximate position to the remote position, and the retracting operation for causing the operating member to move the operated element from the remote position to the proximate position.

Thus, the operating means provided on the mobile body can shift the article support between the article storage position and article transfer position. There is no need to install alongside the path, a member for switching the locking means or a member for shifting the article support. This realizes a reduced number of components installed alongside the path, and a simplified construction.

Further, even when the operating member is displaced from the proper operative position relative to the operated element in the fore and aft direction, the guide means guides the operating member to the proper operative position, whereby the operating member can properly move the operated element from the proximate position to the remote position, and properly shift the article support from the article storage position to the article transfer position.

BRIEF DESCRIPTION OF THE DRAWINGS

FIG. 7 is a perspective view of the article support and fixed frame in an article storage position.

FIG. 14 is a view showing a lock device in a locking state;

FIG. 15 is a view showing the lock device in an unlocking state;

DETAILED DESCRIPTION OF PREFERRED EMBODIMENTS

Article transport facilities according to this invention will be described with reference to the drawings. While a plurality of embodiments are described hereinafter, it is to be understood that any combination of the features of one embodiment and those of another also falls within the scope of this invention.

First Embodiment

Figure 1:
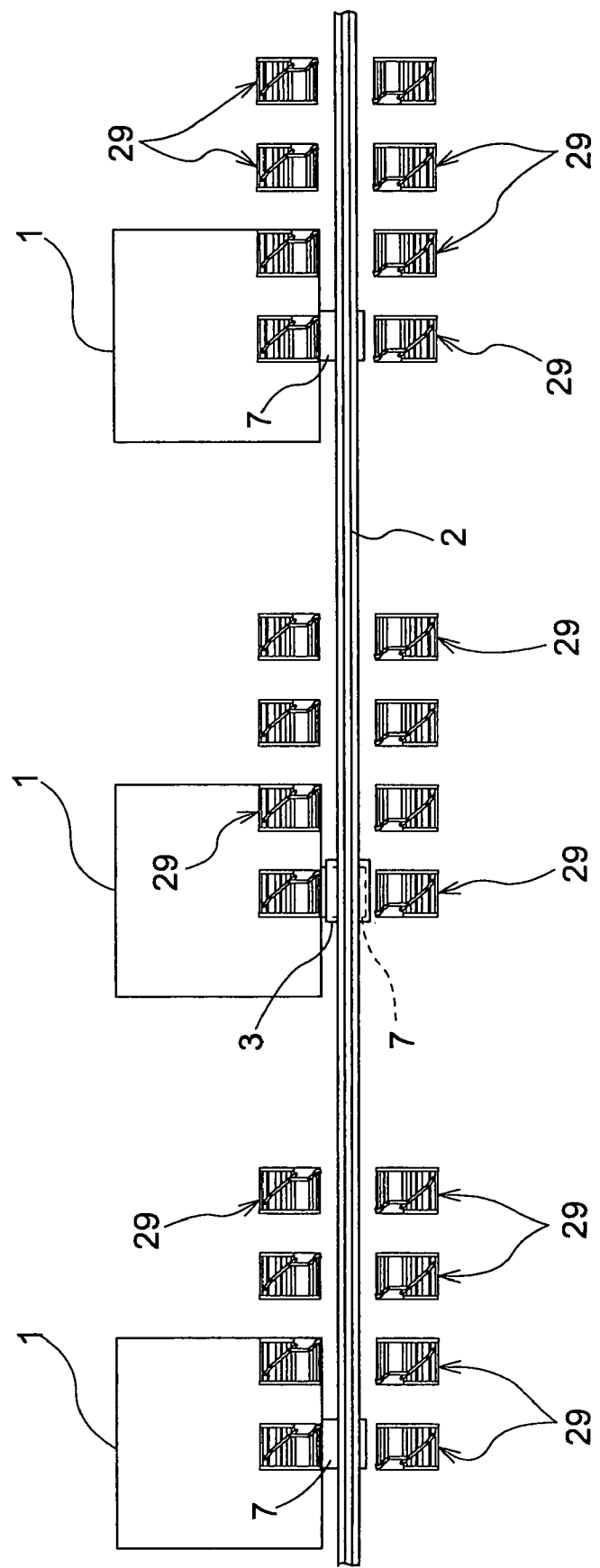
FIG. 1 is a plan view of an article transport facility.
Figure 2:
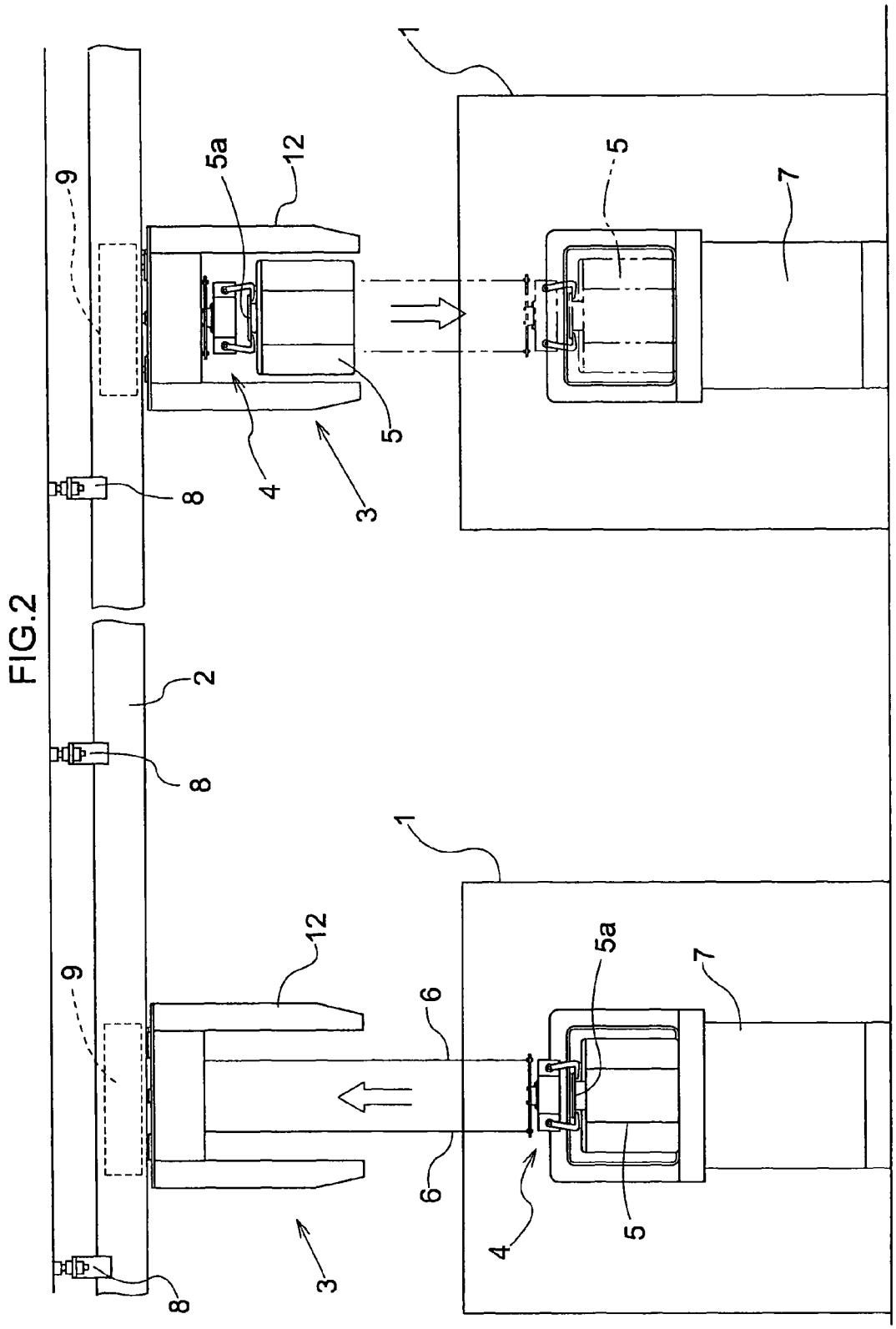
FIG. 2 is a side view of a transport vehicle and a station.

As shown in FIGS. 1 and 2, an article transport facility includes a guide rail 2 installed as a path extending by way of a plurality of article processing units 1, and a transport vehicle 3 (a mobile body or wheeled vehicle) movable along the guide rail 2 for transporting articles. The transport vehicle 3 transports containers 5 (one example of articles) storing semiconductor substrates between the plurality of article processing units 1. Each article processing units 1 performs a predetermined process for partly finished goods in the course of manufacturing semiconductor substrates, for example.

The transport vehicle 3 has a vertically movable gripper 4 for gripping a container 5 in a suspended state. The gripper 4 acts as a holder for holding a container 5.

With the transport vehicle 3 standing still, the gripper 4 is vertically movable, by winding and unwinding wires 6, between an upper position adjacent the transport vehicle 3, and a lower position for article transfer to and from an article transfer station 7 disposed below the transport vehicle 3.

FIG. 2 shows the gripper 4 being lowered from the upper position to the lower position at the right-hand side, and the gripper 4 being raised from the lower position to the upper position at the left-hand side.

The station 7 is in the form of a support table for supporting containers 5. The station 7 serves to receive containers 5 from the transport vehicle 3 for a predetermined process by the article processing unit 1, or to deliver containers 5 having undergone the predetermined process by the article processing unit 1 to the transport vehicle 3. The station 7 is provided for each of the article processing units 1.

The transport vehicle 3 moves along the guide rail 2, with the gripper 4 placed in the upper position. With the transport vehicle 3 stopped in a stopping location corresponding to a station 7 for transfer, among the plurality of stations 7, a container 5 is transferred to or from this station 7 by vertically moving the gripper 4 between the upper position and the lower position.

Figure 3:
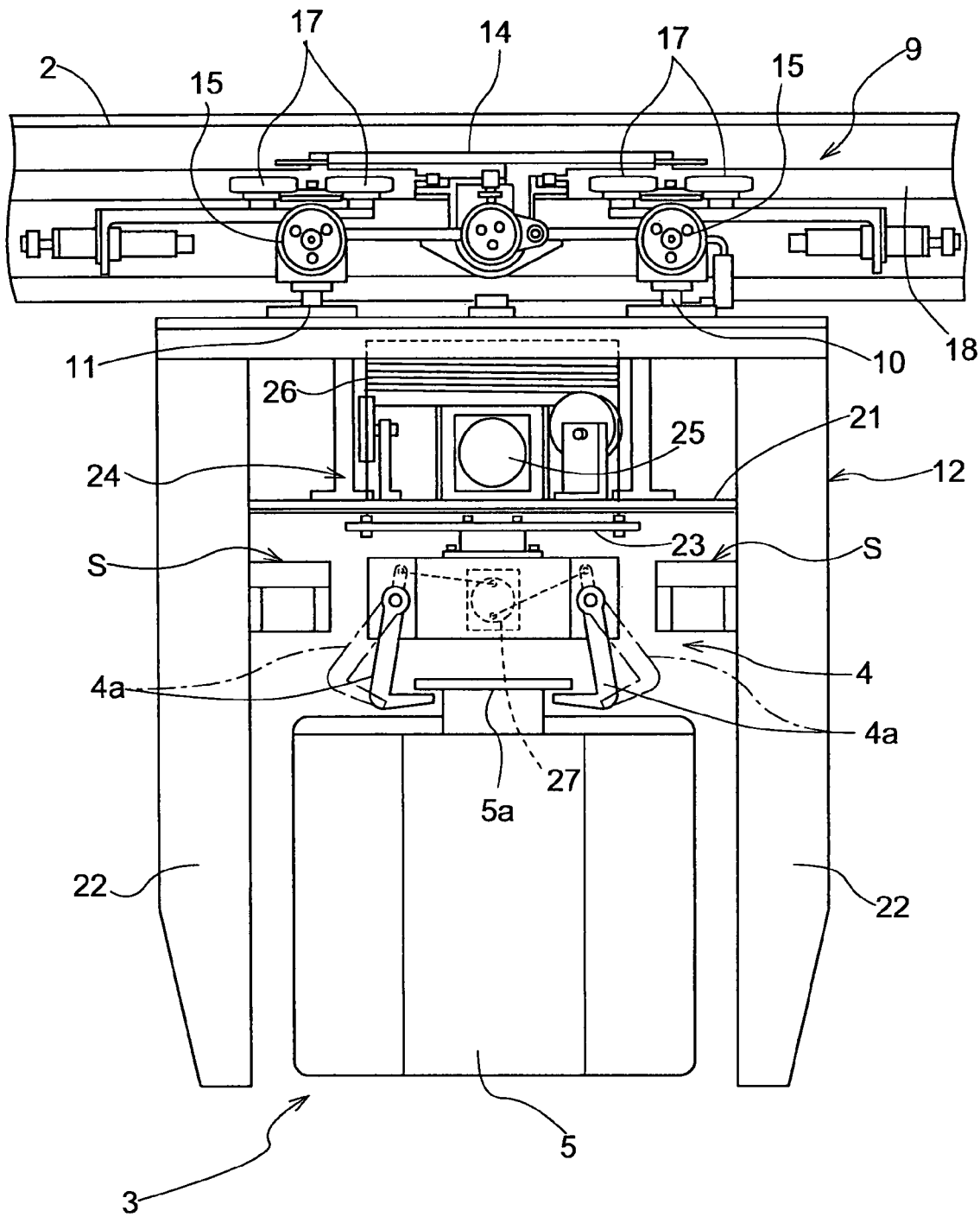
FIG. 3 is a side view of the transport vehicle.
Figure 4:
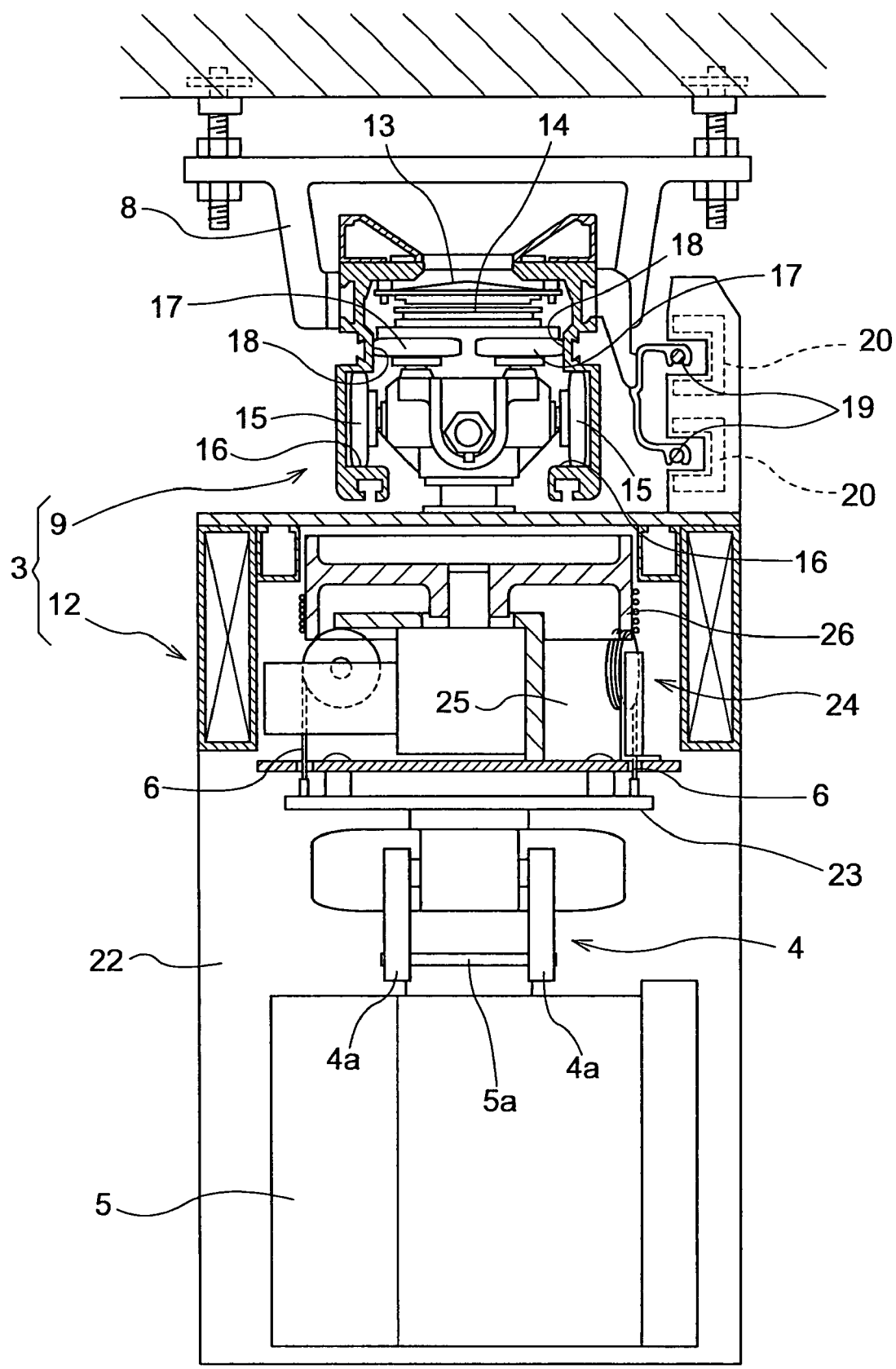
FIG. 4 is a front view in vertical section of the transport vehicle.

As shown in FIGS. 2 through 4, the guide rail 2 is fixed to a ceiling by guide rail brackets 8. The transport vehicle 3 includes an upper vehicle body 9 located in an inner space of the guide rail 2, and a lower vehicle body 12 located under the guide rail 2, which are connected together by fore and aft tubular connectors 10 and 11.

The upper vehicle body 9 has a primary coil 14 disposed close and opposite to a magnet 13 mounted in the inner space of the guide rail 2. The upper vehicle body 9 is the linear motor type propelled by a linear motor formed of the magnet 13 and primary coil 14. The transport vehicle 3 is movable along the guide rail 2 by this propelling force.

In the inner space of the guide rail 2, running guideways 16 are formed for guiding running wheels 15 of the upper vehicle body 9, and anti-swing guideways 18 for guiding anti-swing wheels 17 of the upper vehicle body 9.

The guide rail 2 has feeder lines 19, and the upper vehicle body 9 has receiving coils 20. The feeder lines 19 supplied with AC generate magnetic fields, which cause the receiving coils 20 to generate power required by the transport vehicle 3. Thus, power is supplied in a non-contact mode.

In this embodiment, the mode for driving the upper vehicle body 9 is the linear motor type that obtains propelling force from a linear motor. Alternatively, for example, an electric motor may be provided for rotating the running wheels 15, and the upper vehicle body 9 may be driven by rotating the running wheels 15 with the electric motor.

The lower vehicle body 12 includes a fore and aft frame 21 extending in the fore and aft direction of the transport vehicle 3, and a pair of front and rear vertical frames 22 extending downward from a forward end and a rearward end of the fore and aft frames 21. The lower vehicle body 12 is channel-shaped opening downward in side view, with the gripper 4 disposed at the middle in the fore and aft direction.

The gripper 4 is attached to a lift member 23 vertically movable relative to the upper vehicle body 9. The lift member 23 is supported to be vertically movable by a lift control mechanism 24 attached to the fore and aft frame 21.

The lift control mechanism 24 has four wires 6 wound around a rotating drum 26 rotatable by a drum driving motor 25. The lift control mechanism 24 rotates the rotating drum 26 forward and backward to wind and unwind the four wires 6 simultaneously, thereby moving the lift member 23 up and down while maintaining the lift member 23 in a substantially horizontal position.

Although this embodiment shows the example of winding the wires 6 around the rotating drum 26, the lift member 23 may be vertically moved, for example, by belts wound around the rotating drum 26. Thus, the wires 6 or cables may be replaced with belts. The wires, belts and cables are called flexible members.

The gripper 4 includes a pair of gripping elements 4a for gripping a flange 5a of each container 5. The pair of gripping elements 4a are switchable, with forward and backward rotations of a gripping motor 27, between a gripping position for gripping the flange 5a by the gripping elements 4a rocking toward each other (solid lines in FIG. 3) and a release position for releasing the flange 5a by the gripping elements 4a rocking away from each other (dotted lines in FIG. 3).

The gripper 4 is attached to the lift member 23 to be swivelable about a vertical axis. Though not shown, a swivel motor is provided for swiveling the gripper 4.

In order to keep temporarily the containers 5 transported to the stations 7, as shown in FIG. 1, a plurality of article supports 29 for article storage are arranged at both sides of the guide rail 2. These article supports 29 are arranged along the guide rail 2.

The article supports 29 will be described hereinafter with reference to FIG. 5 through 10.

Figure 7:
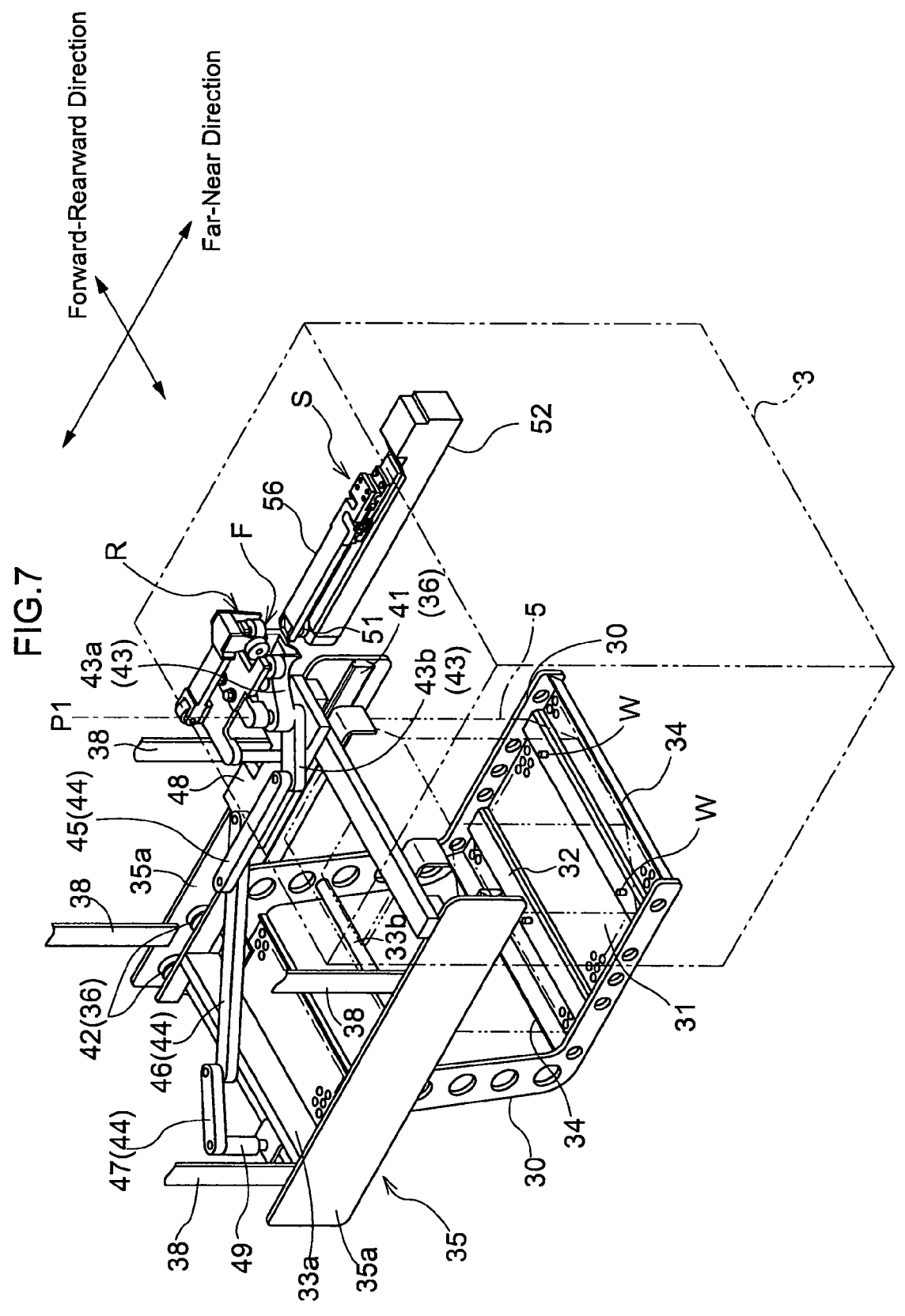
Figure 8:
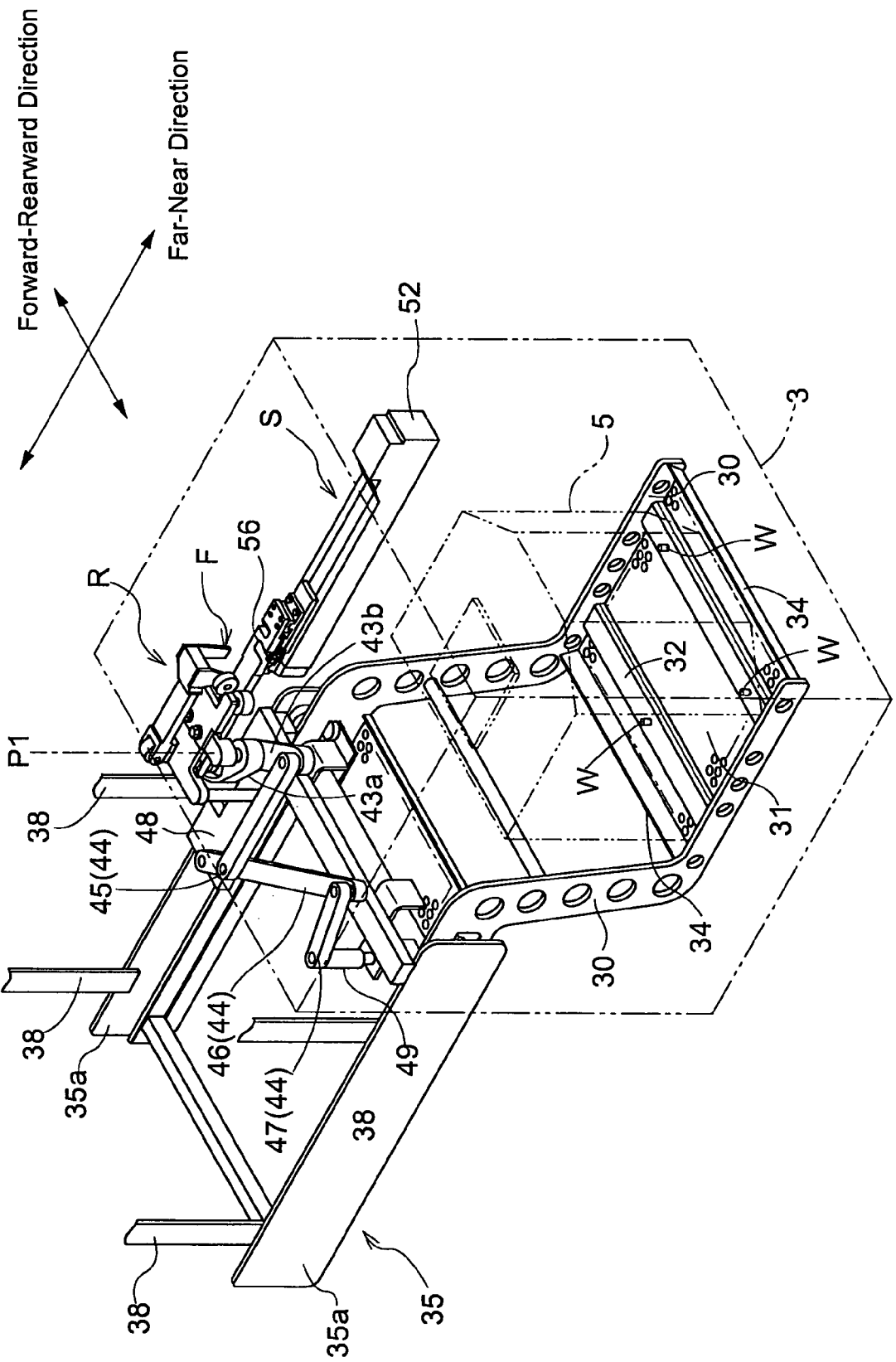
FIG. 8 is a perspective view of the article support and fixed frame in an article transfer position.
Figure 9:
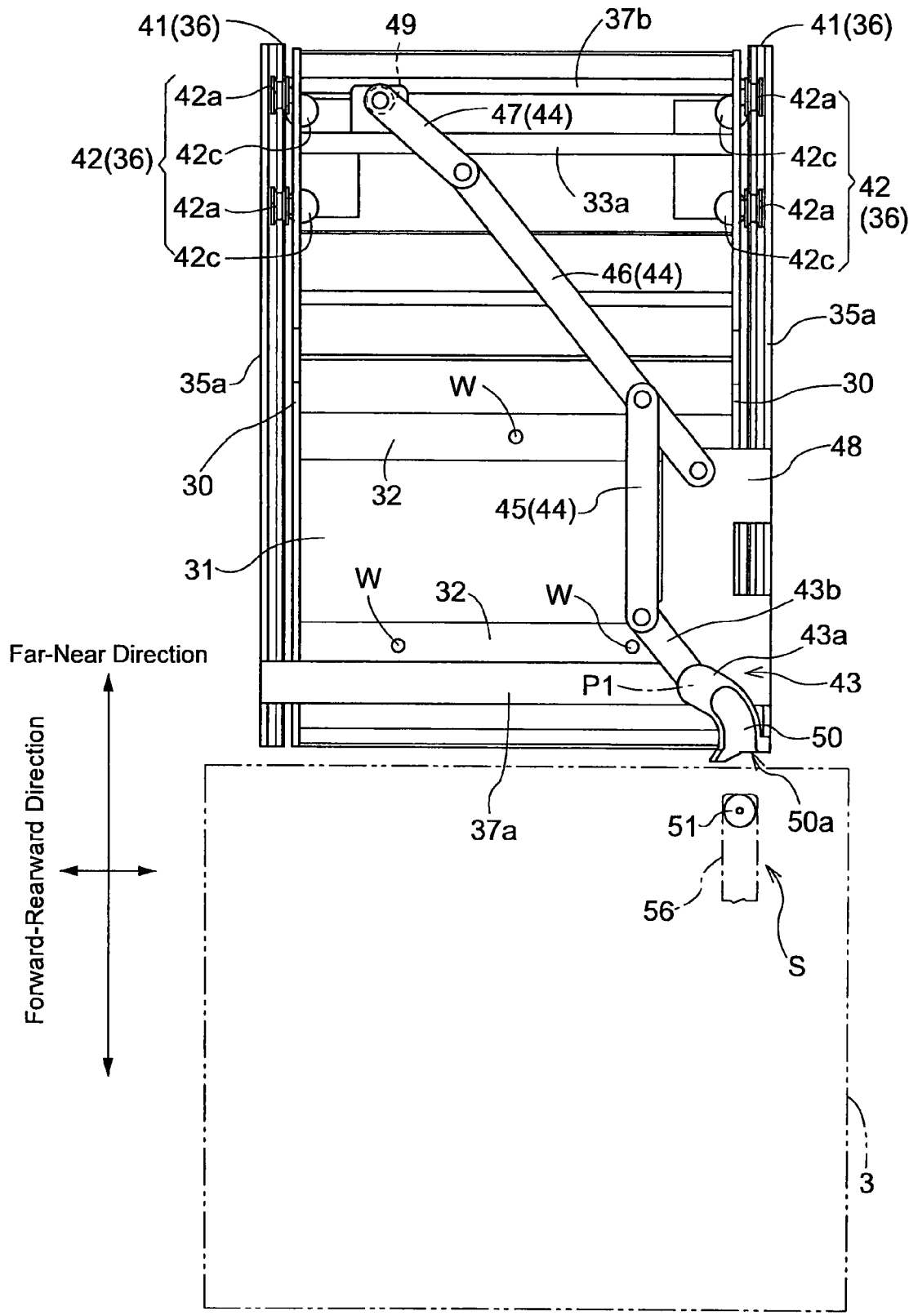
FIG. 9 is a plan view of the article support and fixed frame in the article storage position.

Each of the article supports 29 is shiftable between an article transfer position (shown in FIGS. 8 and 10) for receiving a container 5 from, and delivering a container 5 to, the gripper 4 of the transport vehicle 3 having stopped in the article transfer location corresponding thereto, and an article storage position (shown in FIGS. 7 and 9).

The article transfer location is determined as corresponding to each of the article supports 29. In the fore and aft direction of the transport vehicle 3 standing still in the article transfer location, the article support 29 is formed to have a width smaller than a distance between the pair of front and rear vertical frames 22 of the transport vehicle 3. Thus, when the transport vehicle 3 stops in the article transfer location, the article support 29 is movable into and out of the space between the pair of front and rear vertical frames 22 of the transport vehicle 3.

The article storage position is set to a side of and close to the guide rail 2, but away from the guide rail 2, with respect to the distance to the transport vehicle having stopped in the article transfer location, such that the article support 29, when in the article storage position, will not itself, or the container 5 placed thereon will not, obstruct movement of the transport vehicle 3 or vertical movement of the gripper 4.

The article transfer position is set to substantially the same vertical position as the gripper 4 of the transport vehicle 3 standing still in the article transfer location. Thus, when the article support 29 is in the article transfer position, a container 5 can be transferred between the article support 29 and the gripper 4 located in the position adjacent the upper position of the transport vehicle 3 standing still in the article transfer location.

Figure 5:
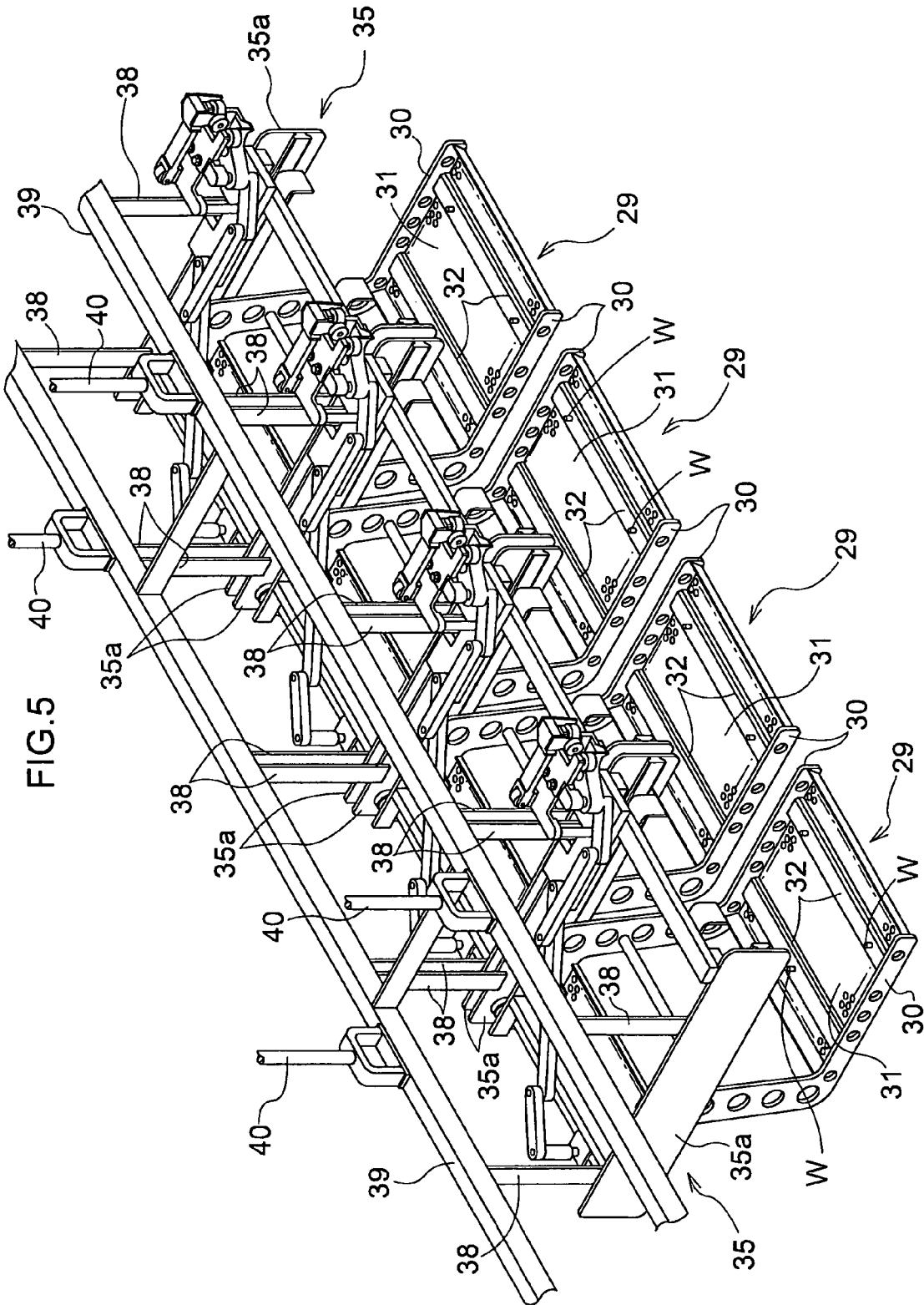
FIG. 5 is a perspective view of an article support and a fixed frame.
Figure 6:
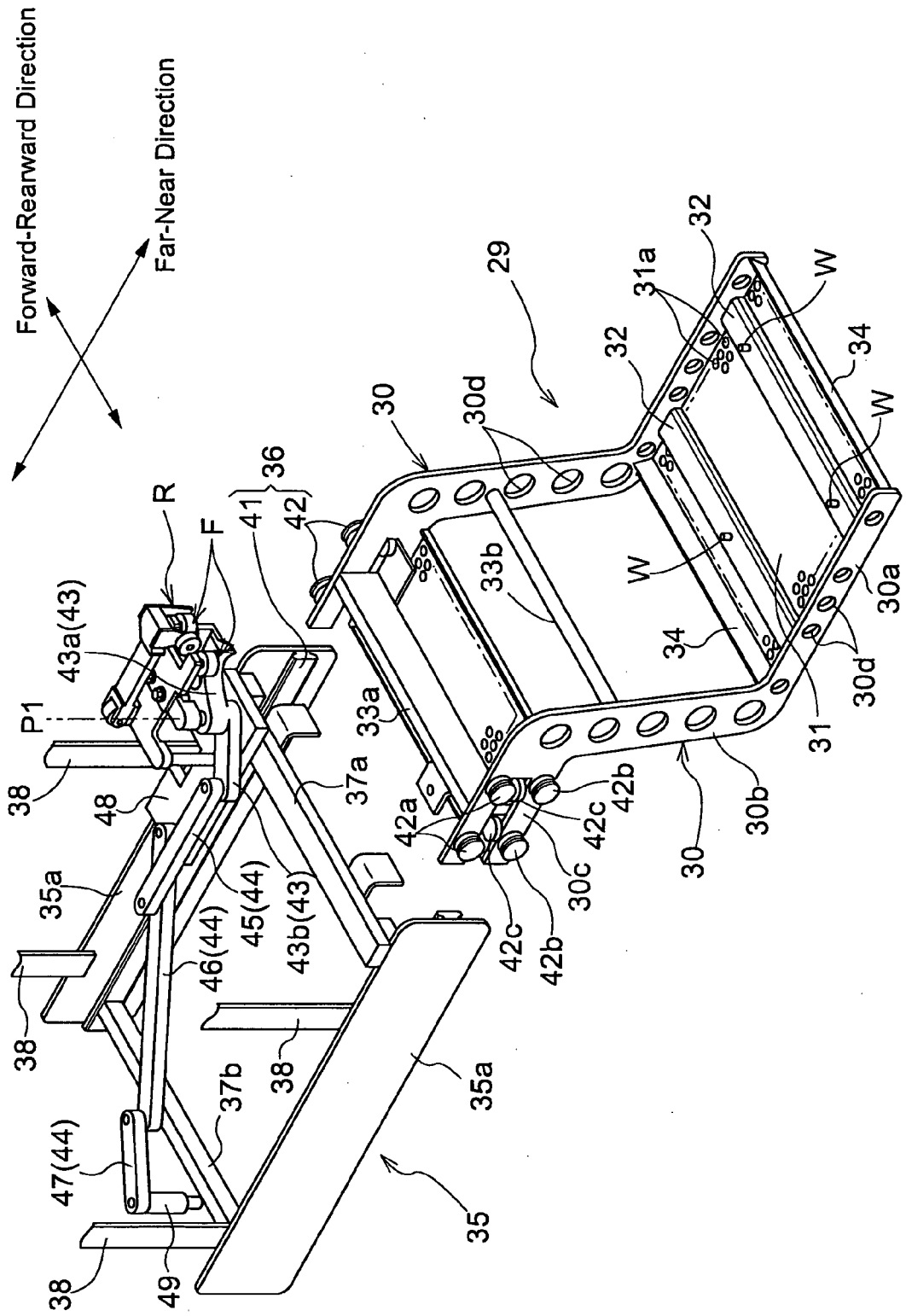
FIG. 6 is an exploded perspective view of the article support and fixed frame.

As shown in FIGS. 5 and 6, each article support 29 is supported to be movable relative to a fixed frame 35 installed as corresponding to the article storage position, toward and away from the transport vehicle 3 standing still in the article transfer location.

The fixed frame 35 is formed of a pair of side frame members 35a arranged at opposite sides of the article support 29 in the fore and aft direction, and elongated in the direction toward and away from, i.e. in the direction of access to, the transport vehicle 3. The pair of side frame members 35a are interconnected by a first frame connector 37a disposed adjacent the transport vehicle 3 standing still in the article transfer location, and a second frame connector 37b spaced from the first frame connector 27a away from the transport vehicle 3 standing still in the article transfer location.

The fixed frame 30 is suspended, with a plurality of mounting extensions 38 extending upward from the pair of side frame members 35a and having upper ends fixed by mounting brackets to two frame supports 39. The frame supports 39 are suspended from the ceiling through suspension bolts 40 to extend longitudinally of and parallel to the guide rail 2.

Thus, the number of article supports 29 may be increased or decreased by attaching or detaching the mounting extensions 38 to/from the frame supports 39. The article supports 29 may be added or deducted with ease.

The fore and aft direction of the transport vehicle 3 standing still in the article transfer location will hereinafter be called the first direction also. The direction toward and away from, or the direction of access to, the transport vehicle 3 standing still in the article transfer location will be called the second direction also.

The article support 29 has a pair of suspension supports 30 extending upward, a bottom plate 31 disposed between the suspension supports 30, and a pair of receiving members 32 arranged on the bottom plate 31 for supporting a container 5. The article support 29 supports a container 5 as positioned by positioning pins W arranged on the receiving members 32.

Each of the suspension supports 30 includes a lower portion 30a connected to the bottom plate 31 and extending in the direction of access, an intermediate portion 30b extending upward from the end of the lower portion 30a remote from the transport vehicle 3, and an upper portion 30c extending in the direction of access from the upper end of the intermediate portion 30b. The pair of suspension supports 30 have the upper portions 30c interconnected by a first suspension connector 33a, and the intermediate portions 30b interconnected by a second suspension connector 33b. A plurality of bores 30d are formed in, and arranged at intervals longitudinally of, the lower portion 30a and intermediate portion 30b of each suspension support 30. The bottom plate 31 has a plurality of bores 31a formed therein and arranged in the fore and aft direction and the direction of access, and has restrictors 34 arranged at opposite ends thereof in the direction of access for contacting side surfaces of a container 5 to restrict movement of the container 5 in the direction of access.

A slide guide mechanism 36 is provided for supporting the article support 29 to be shiftable between the article storage position and article transfer position. The slide guide mechanism 36 supports the article support 29 to be sidable in the direction of access relative to the fixed frame 35.

The slide guide mechanism 36 includes rails 41 formed on the fixed frame 35, and a plurality of guide rollers 42 arranged on the suspension supports 30. With the rails 41 supporting and guiding the guide rollers 42, the slide guide mechanism 36 supports the article support 29 to be slidable relative to the fixed frame 35 between the article storage position and article transfer position.

The rails 41 are formed on the pair of side frame members 35a. The guide rollers 42 are arranged on the upper portions 30c of the suspension supports 30. The guide rollers 42 include three types of rollers, i.e. first guide rollers 42a guided by upper surfaces of the rails 41, second guide rollers 42b guided by lower surfaces of the rails 41, and third guide rollers 42c guided by side surfaces of the rails 41. The upper portion 30c of each suspension support 30 has two first guide rollers 42a spaced from each other in the direction of access, and two second guide rollers 42b also spaced from each other in the direction of access, the first guide rollers 42a and second guide rollers 42b being vertically opposed to each other across the rail 41, and two third rollers 42c also spaced from each other in the direction of access.

The fixed frame 48 includes an operated element 43 supported to be movable in the direction of access between a proximate position (FIGS. 7 and 9) adjacent the transport vehicle 3 standing still in the article transfer location and a remote position (FIGS. 8 and 10) away from the transport vehicle 3. The operated element 43 is linked with the article support 29 such that the operated element 43, when in the proximate position, operates the article support 29 to the article transfer position, and when in the remote position, operates the article support 29 to the article storage position.

The operated element 43 has a longitudinally intermediate part thereof pivotally connected to a plate-like base 48 provided on an upper part of one of the side frame members 35a, to be pivotable about a first pivot axis P1 extending through the position of connection. The operated element 43 includes a first operated portion 43a extending from the first pivot axis P1 toward the transport vehicle 3, when in the proximate position, and a second operated portion 43b extending from the first pivot axis P1 away from the transport vehicle 3, which portions 43a and 43b are formed integral together, with a level difference therebetween.

By rocking about the first pivot axis P1, the operated element 43 switches between the proximate position and remote position. In the proximate position (FIGS. 7 and 9), the first operated portion 43a acting as a forward portion assumes a position closer than the first pivot axis P1 to the transport vehicle 3 standing still in the article transfer location. The first operated portion 43a of operated element 43 has a groove 50 formed therein to extend in a direction crossing the direction of access toward the first pivot axis P1 when the operated element 43 is located in the proximate position. The groove 50 has an opening 50a at the forward end opposed to the transport vehicle 3 standing still in the article transfer location.

Figure 10:
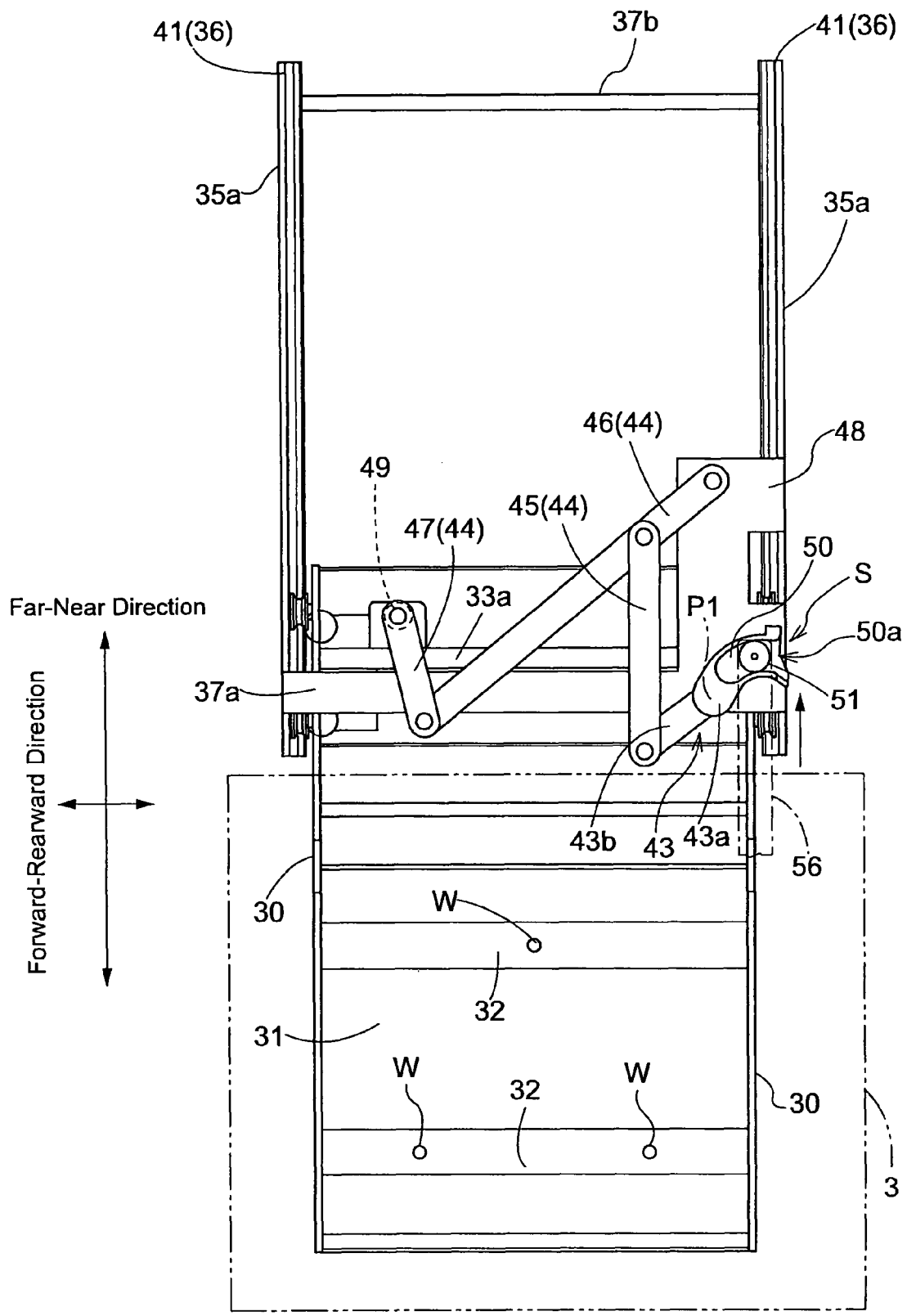
FIG. 10 is a plan view of the article support and fixed frame in the article transfer position.

A linkage mechanism 44 is provided for linking movement of the operated element 43 and that of the article support 29. Thus, when the operated element 43 is located in the proximate position, as shown in FIGS. 7 and 9, the article support 29 is located in the article storage position. When the operated element 43 is located in the remote position, as shown in FIGS. 8 and 10, the article support 29 is located in the article transfer position.

The linkage mechanism 44 includes three link arms, i.e. a first link arm 45, a second link arm 46 and a third link arm 47. The first link arm 45 has one end thereof pivotally connected to one end of the second operated portion 43b of the operated element 43, and the other end pivotally connected to a longitudinally intermediate position of the second link arm 46. The second link arm 46 has one end thereof pivotally connected to the base 48, and the other end pivotally connected to one end of the third link arm 47. The third link arm 47 has the other end pivotally connected to a linking operated element 49 erected on the suspension connector 33.

Figure 11:
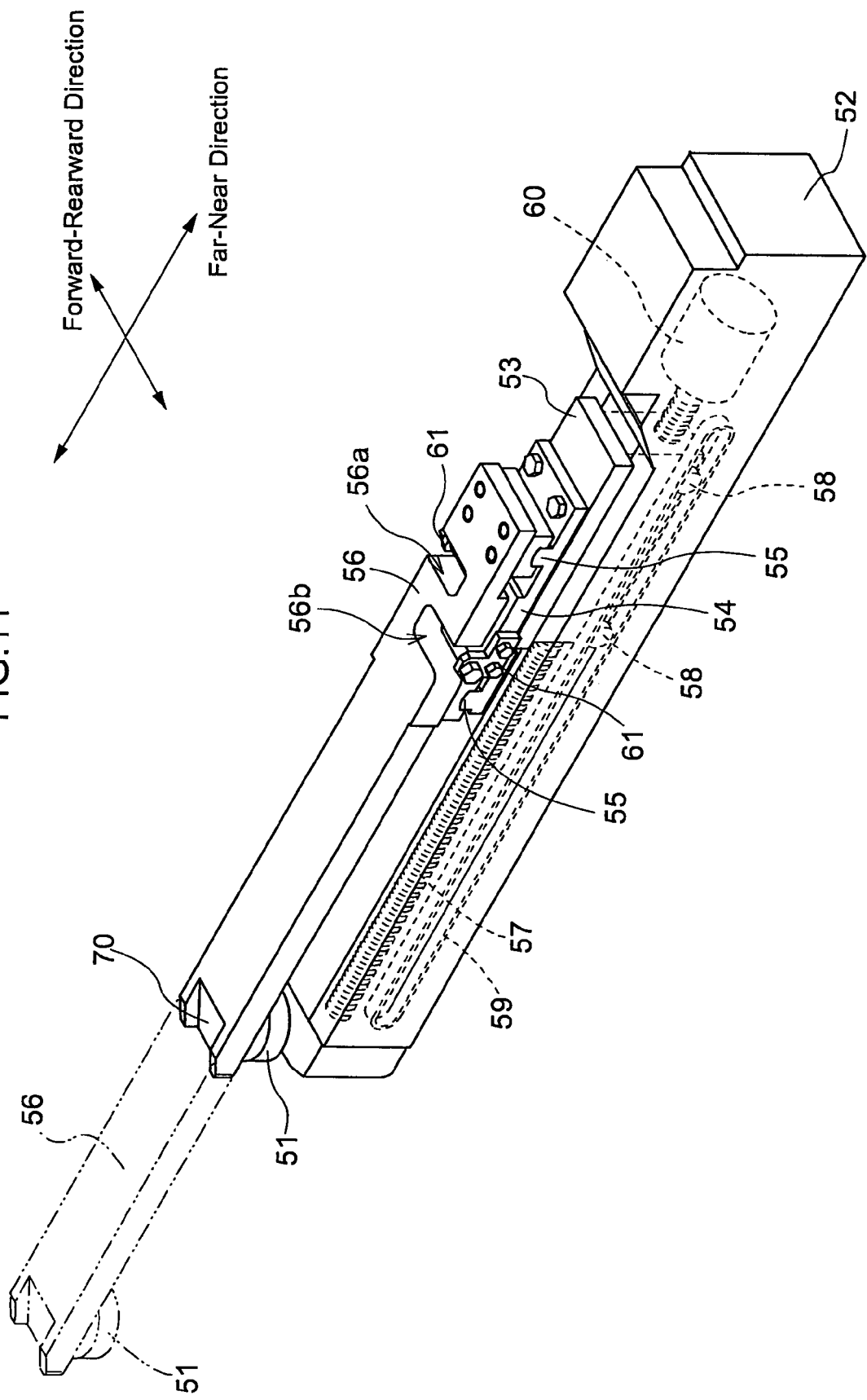
FIG. 11 is a perspective view of an operating device.

The transport vehicle 3 includes an operating device S for shifting the article support 29 between the article storage position and article transfer position. As shown in FIG. 11, the operating device S has an engaging roller 51 supported to be movable forward and backward. In a projecting operation the engaging roller 51 is projected in the direction of access from the transport vehicle 3, and in a retracting operation the engaging roller 51 is retracted to the transport vehicle 3. The engaging roller 51 acts as an article support operating member. The transport vehicle 3 includes such operating device S for acting on the article supports 29 arranged on the right-hand side in the direction of movement of the transport vehicle 3, and a further operating device S for acting on the article supports 29 arranged on the left-hand side.

The operating device S includes a base 52 fixed to the transport vehicle 3 and extending long in the direction of access, a slider 53 movable by rotation of a ball screw 57 mounted in the base 52 to project in the direction of access from the transport vehicle 3 and retract to the transport vehicle 3, and an operating member 56 in the form of an elongate projection and retraction body movable in the direction of access with the slider 53. The operating member 56 is supported to be movable in the fore and aft direction by a guide rail 55 formed on a support table 54 fixed to the slider 53. The engaging roller 51 is attached to a lower surface at a forward end of the operating member 56. The base 52 has elongate grooves 59 formed in opposite side surfaces thereof for guiding guide rollers 58 arranged on the slider 53.

The operating device S rotates a control electric motor 60 to rotate the ball screw 57 in opposite directions for moving the slider 53 in the direction of access. As a result, the engaging roller 51 is projected and retracted in the direction of access.

Biasing springs 61 are provided for biasing the operating member 56 in the fore and aft direction back on the support table 54. The operating member 56 has a first cutout 56a for biasing spring mounting, which is open to one side in the fore and aft direction, and a second cutout 56b for biasing spring mounting, which is open to the other side in the fore and aft direction. The first cutout 56a has one of the biasing springs 61 imparting a biasing force from the one side to the other side in the fore and aft direction. The second cutout 56b has the other biasing spring 61 imparting a biasing force from the other side to the one side in the fore and aft direction.

Thus, two biasing springs 61 are provided for biasing the operating member 56 in the fore and aft direction back on the support table 54. That is, the two biasing springs 61 bias the engaging roller 51 back to neutral position in the fore and aft direction. Only one such biasing spring 61 may be provided as a return biasing device. It is also possible to use a known technique such as an air cylinder. The neutral position is determined such that the center of engaging roller 51 coincides with the center of base 52 in the fore and aft direction.

With the transport vehicle 3 standing still in the article transfer location, the operating device S carries out a projecting operation for causing the engaging roller 51 to move the operated element 43 from the proximate position (FIGS. 7 and 9) to the remote position (FIGS. 8 and 10), and a retracting operation for causing the engaging roller 51 to move the operated element 43 from the remote position (FIGS. 8 and 10) to the proximate position (FIGS. 7 and 9).

The engaging roller 51 has a diameter corresponding to or smaller than the width of the groove 50 of the operated element 43 in the fore and aft direction. Thus, the engaging roller 51 is engageable with and disengageable from the groove 50 of operated element 43 through movement in the direction of access.

The operating device S is constructed the push-pull type such that, in the projecting operation, the engaging roller 51 is moved into engagement with the groove 50 to push the operated element 43 from the proximate position to the remote position, and in the retracting operation, the engaging roller 51 is retained in engagement with the groove 50 to pull the operated element 43 from the remote position to the proximate position, and thereafter the engaging roller 51 is disengaged from the groove 50.

When the operating device S moves the operated element 43 from the proximate position to the remote position with the engaging roller 51 in the projecting operation, the operated element 43 located in the remote position will result in the article support 29 located in the article transfer position. Thus, the article support 29 is shifted from the article storage position to the article transfer position.

When the operating device S moves the operated element 43 from the remote position to the proximate position with the engaging roller 51 in the retracting operation, the operated element 43 located in the proximate position results in the article support 29 located to the article storage position. Thus, the article support 29 is shifted from the article transfer position to the article storage position.

Movements taking place when the article support 29 is shifted between the article storage position and article transfer position will be described.

When the operated element 43 is located in the proximate position as shown in FIGS. 7 and 9, the opening 50a of the groove 50 opens in the direction of access. The operating device S executes the projecting operation to move the engaging roller 51 in the direction of access to project from the transport vehicle 3, and through the opening of the groove 50 into the groove 50 to engage the latter. As the engaging roller 51 engaging the groove 50 is further moved in the direction of access to project from the transport vehicle 3, the engaging roller 51, while pressing a side wall of the groove 50, moves through the groove 50 to push the operated element 43 from the proximate position to the remote position. As the operated element 43 rocks from the proximate position to the remote position, the first link arm 45, second link arm 46 and third link arm 47 of the linkage mechanism 44 rock successively, to move the linking operated element 49 toward the transport vehicle 3. The movement of the linking operated element 49 toward the transport vehicle 3, with the slide guide mechanism 36 slidably supporting and guiding the article support 29, shifts the article support 29 from the article storage position to the article transfer position as shown in FIGS. 8 and 10.

When the operating device S executes the retracting operation, with the operated element 43 located in the remote position as shown in FIGS. 8 and 10, the engaging roller 51 will move toward the transport vehicle 3 while engaging the groove 50. The engaging roller 51 moves through the groove 50 while pressing a side wall of the groove 50, to pull the operated element 43 from the remote position to the proximate position. As the operated element 43 rocks from the remote position to the proximate position, the first link arm 45, second link arm 46 and third link arm 47 of the linkage mechanism 44 rock successively, to move the linking operated element 49 away from the transport vehicle 3. The movement of the linking operated element 49 away from the transport vehicle 3, with the slide guide mechanism 36 slidably supporting and guiding the article support 29, shifts the article support 29 from the article transfer position to the article storage position. When the operated element 43 is located in the proximate position as shown in FIGS. 7 and 9, the opening 50a of the groove 50 opens in the direction of access. Thus, the engaging roller 51 moving toward the transport vehicle 3 will become disengaged from the groove 50 and retract to the transport vehicle 3.

Thus, the operating device S executes the projecting operation for causing the engaging roller 51 to move the operated element 43 from the proximate position to the remote position. If the engaging roller 51 is displaced in the fore and aft direction from a proper operative position relative to the operated element 43 at this time, the engaging roller 51 may not be able to engage the groove 50 of operated element 43. There is a possibility that the operated element 43 cannot be moved from the proximate position to the remote position. The proper operative position is set to a position where the center of engaging roller 51 coincides, in the fore and aft direction, with the center of the groove 50 of operated element 43 located in the proximate position, so that the engaging roller 51 can engage the groove 50 of operated element 43.

Figure 12:
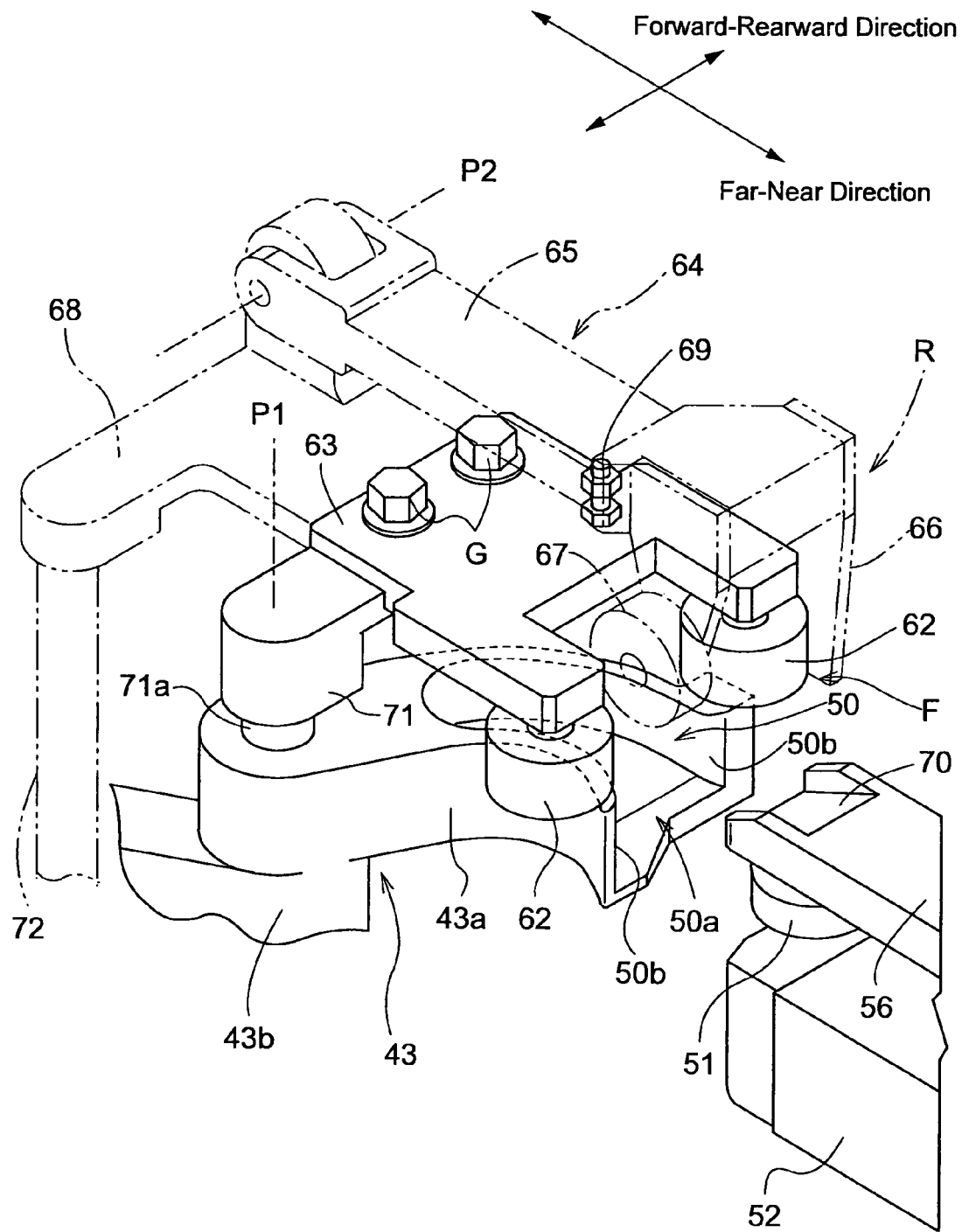
FIG. 12 is an enlarged view of a principal portion of the article support.
Figure 13:
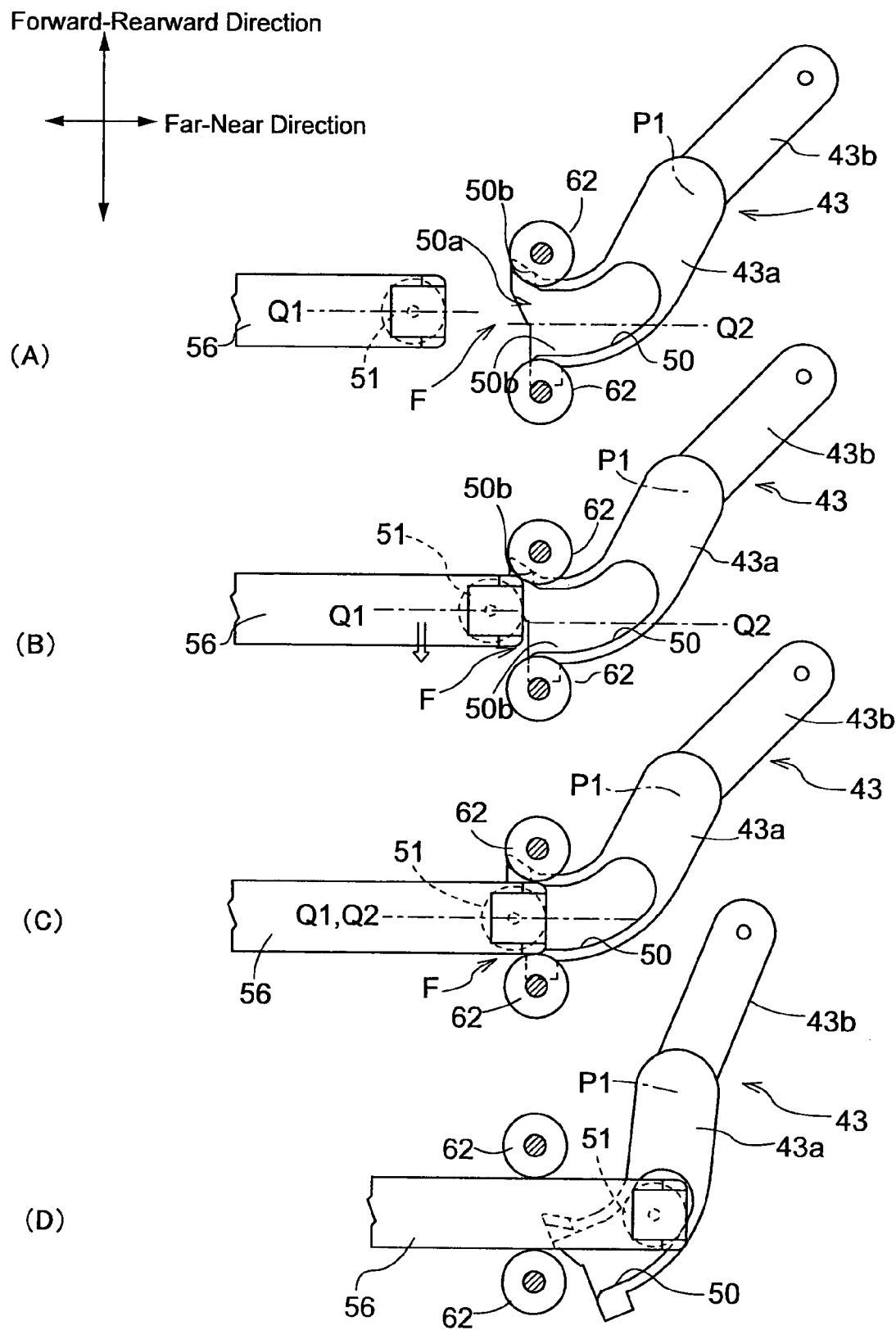
FIG. 13 is a view showing control unit guiding states of a guide device.

As shown in FIGS. 12 and 13, a guide device F (guide member) is provided for guiding the engaging roller 51 in the fore and aft direction to the proper operative position relative to the operated element 43 when the operating device S executes the projecting operation. The guide device F includes guide rollers 62 acting as guide elements arranged at opposite sides of the proper operative position in the fore and aft direction for guiding the engaging roller 51 to the proper operative position.

The guide rollers 62 are supported by a guide roller support 63 to be rotatable about vertical axes in opposite end regions in the fore and aft direction of the opening 50a of the groove 50 of operated element 43 located in the proximate position. The guide roller support 63 has a proximal end received and supported by a receiving support 71, and a distal end bifurcated in the fore and aft direction. The guide roller support 63 is connected to the receiving support 71 by connecting elements G such as bolts and nuts 71. The guide rollers 62 are arranged on the respective forks at the distal end of the guide roller support 63. The receiving support 71 is fixed to a shaft 71a having the first pivot axis P1 of the operated element 43.

The guide rollers 62 guide the operating member 56 in the fore and aft direction by rotating in contact with corners at the forward end of operating member 56. With the two guide rollers 62 guiding the operating member 56 to a position therebetween, the engaging roller 51 is guided to the proper operative position.

The guide device F is constructed to guide the engaging roller 51 in the direction of access continuously, while the engaging roller 51 is located in the proper operative position in the fore and aft direction, after guiding the engaging roller 51 to the proper operative position. That is, after guiding the operating member 56 to the position therebetween, the two guide rollers 62 continue to rotate in contact with the opposite side surfaces of the operating member 56 to guide the operating member 56 along the direction of access.

The operated element 43 has guide surfaces 50b formed adjacent the opening 50a of the groove 50 for guiding the engaging roller 51 to the proper operative position. The guide surfaces 50b are wider apart in the fore and aft direction at an entrance than the width of the engaging roller 51, and become narrower as they extend further away from the transport vehicle 3 standing still in the article transfer location. The opposite walls in the fore and aft direction are inclined to approach each other, so that the guide surfaces 50b adjacent the opening 50a of the groove 50 become narrower in the fore and aft direction as they extend away from the transport vehicle 3. Thus, the guide surfaces 50b contact the engaging roller 51 to guide the engaging roller 51 to the proper operative position.

Movements taking place when the operating device S executes the projecting operation and the guide device F guides the engaging roller 51 to the proper operative position will be described with reference to FIG. 13.

When the center Q1 of the engaging roller 51 is displaced from a proper operative position Q2, a corner at the forward end of the operating member 56 contacts one of the guide rollers 62 to rotate the guide roller 62. Consequently, as shown in FIG. 13 (B), the operating member 56 is guided between the two guide rollers 62 in the fore and aft direction, whereby the center Q1 of engaging roller 51 is brought into agreement with the proper operative position Q2. When the guide surfaces 50b adjacent the opening 50a of the groove 50 contact the engaging roller 51 at this time, the guide surfaces 50b also guide the engaging roller 51 to bring the center Q1 of engaging roller 51 into agreement with the proper operative position Q2. Thus, the guiding action of the guide device F and the guiding action of the guide surfaces 50b can accurately guide the engaging roller 51 to the proper operative position.

As shown in FIG. 13 (C), after guiding the operating member 56 to the position therebetween in the fore and aft direction, the two guide rollers 62 continue to rotate in contact with the opposite side surfaces of the operating member 56 to guide the operating member 56 along the direction of access. Consequently, the engaging roller 51 located in the proper operative position in the fore and aft direction is guided along the direction of access.

In this way, the engaging roller 51 is guided by the guide device F to the proper operative position. As shown in FIG. 11, the operating member 56 is supported to be movable in the fore and aft direction by the guide rail 55 formed on the support table 54. This allows the guide device F and guide surfaces 50b to guide the engaging roller 51 smoothly.

When the operating device S executes the retracting operation after the projecting operation, the guiding action of the guide device F and the guiding action of the guide surfaces 50b are canceled. Then, as shown in FIG. 11, the operating member 56 is biased back in the fore and aft direction by the biasing force of the two biasing springs 61, whereby the engaging roller 51 will return to the neutral position in the fore and aft direction, and will retract to the transport vehicle 3.

When the operating device S executes the retracting operation as described above, the article support 29 is shifted from the article transfer position to the article storage position. If the article support 29 moved accidentally from the article storage position to the article transfer position, the article support 29 could overshoot to the path of transport vehicle 3. There is a possibility that the article support 29 contacts the transport vehicle 3.

Thus, as shown in FIGS. 12, 14 and 15, a lock device R (locking apparatus) is provided to be switchable between a locking state (FIG. 14) for locking the article support 29 to the article storage position, and an unlocking state (FIG. 15) for releasing the article support 29. The lock device R includes a locking member 64 shiftable between a locking position (FIG. 14) for locking the operated element 43 against shifting from the proximate position to the remote position, and an unlocking position (FIG. 15) for permitting the operated element 43 to shift between the proximate position and remote position. The locking member 64 is shiftable, by rocking about a pivot axis, between the locking position (FIG. 14 (A)) and the unlocking position (FIG. 15 (A)) above the locking position while being biased to the locking position.

On the other hand, the operating device S includes a lock device operating portion 70 of the extension and retraction type for switching the lock device R from the locking state to the unlocking state by projecting in the direction of access from the transport vehicle 3, and switching the lock device R from the unlocking state to the locking state by retracting in the direction of access to the transport vehicle 3. The lock device operating portion 70 is a pressing slope formed on the upper surface adjacent the forward end of the operating member 56 to extend in the direction of access downward toward the forward end of the operating member 56.

Thus, the operating member 56 acting as an extension and retraction member has the engaging roller 51 for controlling the article support and the operating portion 70 for controlling the lock device. When the operating device S executes the projecting operation, the engaging roller 51 and lock device operating portion 70 move in the direction of access to project from the transport vehicle 3. When the operating device S executes the retracting operation, the engaging roller 51 and lock device operating portion 70 move in the direction of access to retract to the transport vehicle 3.

The locking member 64 includes a rocking arm 65 (control arm) provided to be pivotable about a second pivot axis P2 extending horizontally, a lock plate 66 depending from a distal end of the rocking arm 65, a pressed roller 67 attached to the distal end of the rocking arm 65 and arranged with and spaced in the fore and aft direction from the lock plate 66 to be rotatable about a horizontal axis.

The rocking arm 65 has a proximal end thereof pivotally connected to a lock support deck 68 to be pivotable about the second pivot axis P2. The lock support deck 68 is supported by a bar-like support 72 erected on the base 48 and by the receiving support 71. The receiving support 71 supports the guide roller support 63 besides the lock support deck 68. The lock support deck 68 and guide roller support 63 are vertically stacked and fastened together by a connecting element G such as a bolt, such that the lock support deck 68 is located under the guide roller support 63.

With rocking about the second pivot axis P2 of the rocking arm 65, the locking member 64 is switchable between the locking position (FIG. 14) and the unlocking position (FIG. 15) above the locking position. The locking member 64 is biased to the locking position by the weight of the rocking arm 65. A locking stopper 69 is provided for receiving and supporting the rocking arm 65 to limit downward rocking of the rocking arm 65. The locking stopper 69 is disposed such that the locking member 64 is located in the locking position when the rocking arm 65 is received and supported by the stopper 69.

When the locking member 64 is located in the locking position as shown in FIG. 14 (B), the lock plate 66 assumes a locking state for contacting a side surface of the operated element 43 located in the proximate position to limit rocking of the operated element 43 from the proximate position to the remote position. When the locking member 64 is located in the unlocking position as shown in FIG. 15 (B), the lock plate 66 assumes an unlocking state retracted upward from the operated element 43 to permit rocking of the operated element 43 between the proximate position and remote position.

The locking member 64 is pushed from the locking position to the unlocking position by pressure application from the lock device operating portion 70 moving to project from the transport vehicle 3. The pressure from the lock device operating portion 70 acting in the direction from the locking position to the unlocking position is canceled by movement of the lock device operating portion 70 to retract to the transport vehicle 3.

Specifically, as shown in FIG. 12, the pressed roller 67 lies between the two guide rollers 62 when the locking member 64 is located in the locking position. The pressed roller 67 is pushed upward by the lock device operating portion 70 in the movement to project from the transport vehicle 3. The upward pressure from the lock device operating portion 70 is canceled by movement of the lock device operating portion 70 to retract to the transport vehicle 3.

With the pressed roller 67 pushed upward by the lock device operating portion 70, the locking member 64 is moved from the locking position to the unlocking position. When the upward pressure applied from the lock device operating portion 70 to the pressed roller 67 is canceled, the locking member 64 is freed from the force pushing it from the locking position to the unlocking position.

Movement of the lock device operating portion 70 and movement of the lock device R will be described.

When the locking member 64 is located in the locking position as shown in FIG. 14, the operating device S executes the projecting operation to move the lock device operating portion 70 formed at the forward end of the operating member 56 in the direction to project from the transport vehicle 3. Then, the lock device operating portion 70 contacts the pressed roller 67. As the lock device operating portion 70 moves in the direction to project from the transport vehicle 3, the pressed roller 67 is pushed upward by the lock device operating portion 70. Consequently, the rocking arm 65 rocks upward to switch the locking member 64 from the locking position to the unlocking position. When the locking member 64 is shifted to the unlocking position in this way, as shown in FIG. 15, the lock plate 66 is retracted to the unlocking position above the operated element 43 for permitting the operated element 43 to rock from the proximate position to the remote position.

When the locking member 64 is located in the unlocking position as shown in FIG. 15, the operating device S executes the retracting operation to move the lock device operating portion 70 formed at the forward end of the operating member 56 in the direction to retract to the transport vehicle 3. As the lock device operating portion 70 moves in the direction to retract to the transport vehicle 3, the pressed roller 67 rolls down the slope of the lock device operating portion 70. Consequently, the rocking arm 65 rocks downward. When the lock device operating portion 70 separates from the pressed roller 67, the rocking arm 65 rocks downward by gravity to be received and supported by the lock stopper 69, to shift the locking member 64 from the unlocking position to the locking position. When the locking member 64 is shifted to the locking position in this way, the lock plate 66 is placed in the locking state for contacting the side surface of the operated element 43 to prohibit rocking of the operated element 43 from the proximate position to the remote position.

As described above, the operating device S executes the projecting operation and retracting operation to switch the lock device R between the locking state and unlocking state. The operating device S shifts the article support 29 and lock device R in the following manner. In the projecting operation, the operating device S switches the lock device R from the locking state to the unlocking state, and thereafter shifts the article support 29 from the article storage position to the article transfer position. In the retracting operation, the operating device S shifts the article support 29 from the article transfer position to the article storage position, and thereafter switches the lock device R from the unlocking state to the locking state.

To described this more particularly, when the operating device S executes the projecting operation, both the engaging roller 51 and lock device operating portion 70 provided at the forward end of the operating member 56 will move in the direction of access to project from the transport vehicle 3. However, since the pressed roller 67 is disposed in the entrance portion of the groove 50 of operated element 43 in the direction of access, the lock device operating portion 70 will push up the pressed roller 67 before the engaging roller 51 engages the groove 50. Thus, the pressed roller 67 is first pushed up by the lock device operating portion 70 to push the locking member 64 from the locking position to the unlocking position to switch the lock device R from the locking state to the unlocking state.

When the lock device R is switched from the locking state to the unlocking state, the operated element 43 is permitted to rock from the proximate position to the remote position. The engaging roller 51 engages the groove 50, and pushes the operated element 43 from the proximate position to the remote position. Before the lock device R is switched to the unlocking state, the lock plate 66 prohibits rocking of the operated element 43 from the proximate position to the remote position even if the engaging roller 51 attempts to push the operated element 43 from the proximate position toward the remote position. When the operated element 43 is located in the remote position, the operated element 43 moves the article support 29 from the article storage position to the article transfer position. Thus, the article support 29 is shifted from the article storage position to the article transfer position.

When the operating device S executes the retracting operation, the engaging roller 51 and lock device operating portion 70 provided at the forward end of the operating member 56 will move in the direction of access to retract to the transport vehicle 3. First, the engaging roller 51 engages the groove 50, and pulls the operated element 43 from the remote position to the proximate position. When the operated element 43 is located in the proximate position, the operated element 43 places the article support 29 from the article transfer position to the article storage position. Thus, the article support 29 is shifted from the article transfer position to the article storage position.

Subsequently, when the engaging roller 51 disengages from the groove 50, the lock device operating portion 70 will separate from the pressed roller 67, thereby canceling the upward pressure applied from the lock device operating portion 70 to the pressed roller 67. Then, the cancellation of the upward pressure applied to the pressed roller 67, in turn, cancels the pressing force of the lock device operating portion 70 for pushing the locking member 64 from the locking position to the unlocking position. Thus, the lock device R is switched from the unlocking state to the locking state.

Figure 16:
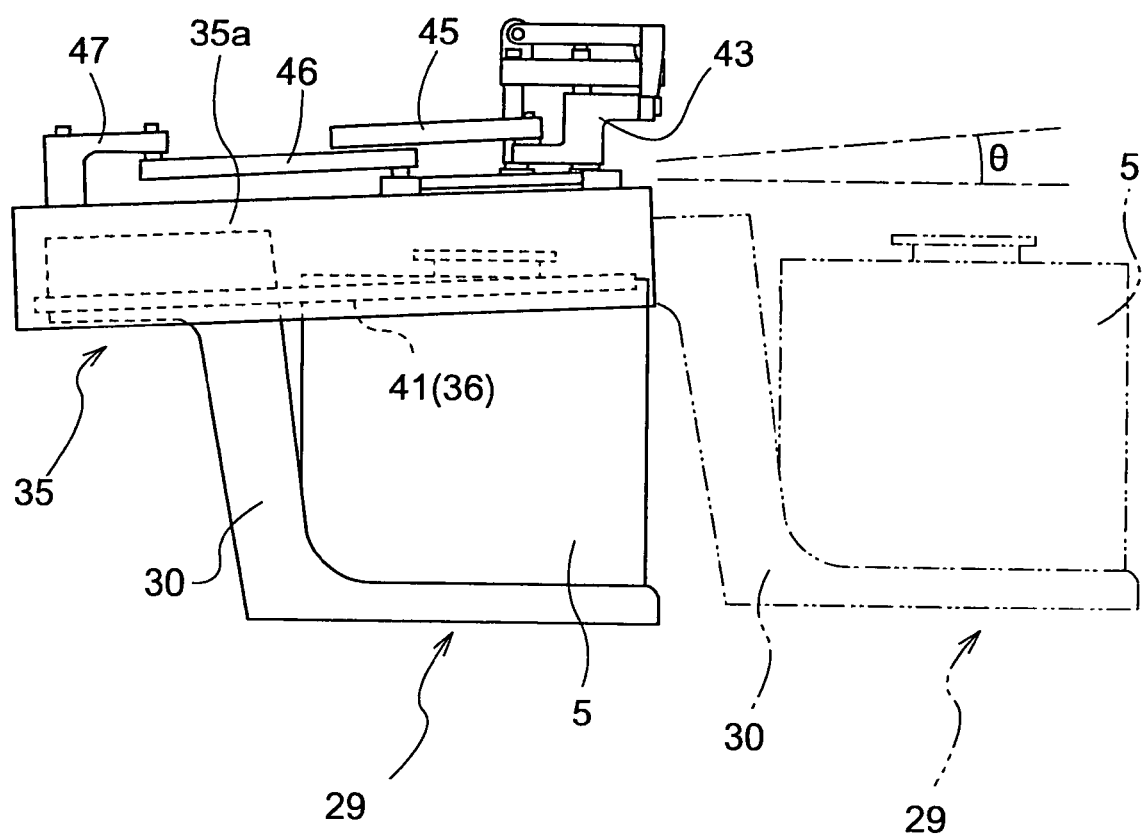
FIG. 16 is a view seen longitudinally of guide rails of the article support and fixed frame.

As shown in FIG. 16, the slide guide mechanism 36 supports the article support 29 to be slidable relative to the fixed frame 35, obliquely to the horizontal, between the article storage position and the article transfer position above the article storage position.

Specifically, each rail 41 is inclined from one end to the other end by a set angle θ (e.g. 2 degrees) to the horizontal. Thus, the lowest point of each rail 41 is the end remote in the direction of access from the transport vehicle 3 standing still in the article transfer location, and the highest the end close to the transport vehicle 3. The set angle θ desirably is between 0.5 and 10 degrees, and more desirably between 1 and 5 degrees.

Thus, the slide guide mechanism 36 is constructed as a slide guide support device for supporting the article support 29 to be slidable between the article storage position and article transfer position, while biasing the article support 29 to the article storage position using the weight of the article support 29.

The transport vehicle 3 includes a carriage controller for controlling operation of the transport vehicle 3. Based on commands from a supervising computer that controls operation of the entire article transport facility, and on detection information from various sensors provided on the transport vehicle 3, the carriage controller controls movement of the transport vehicle 3, lifting operation of the gripper 4, operation of the gripping motor 27, and operation of the control electric motor 60 of the operating device S.

When, for example, the supervising computer gives a transport command indicating a transport starting station 7 and a destination station 7 among the plurality of stations 7, and instructing an operation to transport a container 5 from the starting station 7 to the destination station 7, the carriage controller controls operation of the transport vehicle 3 to receive the container 5 from the starting station 7, and deliver the container 5 to the destination station 7.

When receiving the container 5 from the starting station 7, the carriage controller first controls movement of the transport vehicle 3 to stop the transport vehicle 3 in a stopping position corresponding to the starting station 7. Next, with the transport vehicle 3 standing still in the stopping position corresponding to the starting station 7, the carriage controller performs lift control of the gripper 4 to lower the gripper 4 from the upper position to the lower position. When the gripper 4 is located in the lower position, the carriage controller operates the gripping motor 27 to switch the pair of gripping elements 4a to the gripping position, whereby the gripping elements 4a grip the flange 5a of the container 5. The container 5 is received in this way. Subsequently, the carriage controller performs lift control of the gripper 4 to raise the gripper 4 from the lower position to the upper position. Then, the carriage controller controls movement of the transport vehicle 3 to stop the transport vehicle 3 in a stopping position corresponding to the destination station 7.

When the transport vehicle 3 has stopped in the stopping position corresponding to the destination station 7, the carriage controller delivers the container 5 to the destination station 7 by lift control of the gripper 4 and operation of the gripping motor 27, as performed when receiving the container 5 from the starting station 7.

The supervising computer may give a storage command indicating one of the plurality of article supports 29, and instructing an operation to store a container 5 on the indicated article support 29. Such a case will be described hereinafter.

The carriage controller first controls movement of the transport vehicle 3 to move the transport vehicle 3 to an article transfer location corresponding to the article support 29 for transfer. Next, with the transport vehicle 3 standing still in the article transfer location corresponding to the article support 29 for transfer, the carriage controller operates the control electric motor 60 for the control devise S to execute the projecting operation. In the projecting operation of the operating device S, the guide device F guides the engaging roller 51 to the proper operative position to switch the lock device R from the locking state to the unlocking state. Then, the article support 29 is shifted from the article storage position to the article transfer position. After performing lift control of the gripper 4 to lower the gripper 4 from the upper position to a position adjacent the article support 29, the carriage controller operates the gripping motor 27 to switch the pair of gripping elements 4a to the release position, thereby delivering the container 5 from the gripper 4 to the article support 29 located in the article transfer position. Then, after performing lift control of the gripper 4 to raise the gripper 4 to the upper position, the carriage controller operates the control electric motor 60 for the control devise S to execute the retracting operation. In the retracting operation of the operating device S, the article support 29 is shifted from the article transfer position to the article storage position. Then, the lock device R is switched from the unlocking state to the locking state.

The supervising computer may give a fetch command indicating one of the plurality of article supports 29, and instructing an operation to fetch a container 5 from the indicated article support 29. Such a case will be described hereinafter.

The carriage controller controls movement of the transport vehicle 3, as in the case of the storage command, to stop the transport vehicle 3 in an article transfer location corresponding to the article support 29 for transfer. Then, the carriage controller operates the control electric motor 60 for the control devise S to execute the projecting operation. In the projecting operation of the operating device S, the guide device F guides the engaging roller 51 to the proper operative position to switch the lock device R from the locking state to the unlocking state. Then, the article support 29 is shifted from the article storage position to the article transfer position. After performing lift control of the gripper 4 to lower the gripper 4 from the upper position to a position adjacent the article support 29, the carriage controller operates the gripping motor 27 to switch the pair of gripping elements 4a to the gripping position, thereby receiving the container 5 from the article support 29. Then, after performing lift control of the gripper 4 to raise the gripper 4 to the upper position, the carriage controller operates the control electric motor 60 for the control devise S to execute the retracting operation. In the retracting operation of the operating device S, the article support 29 is shifted from the article transfer position to the article storage position. Then, the lock device R is switched from the unlocking state to the locking state.

Second Embodiment

Figure 17:
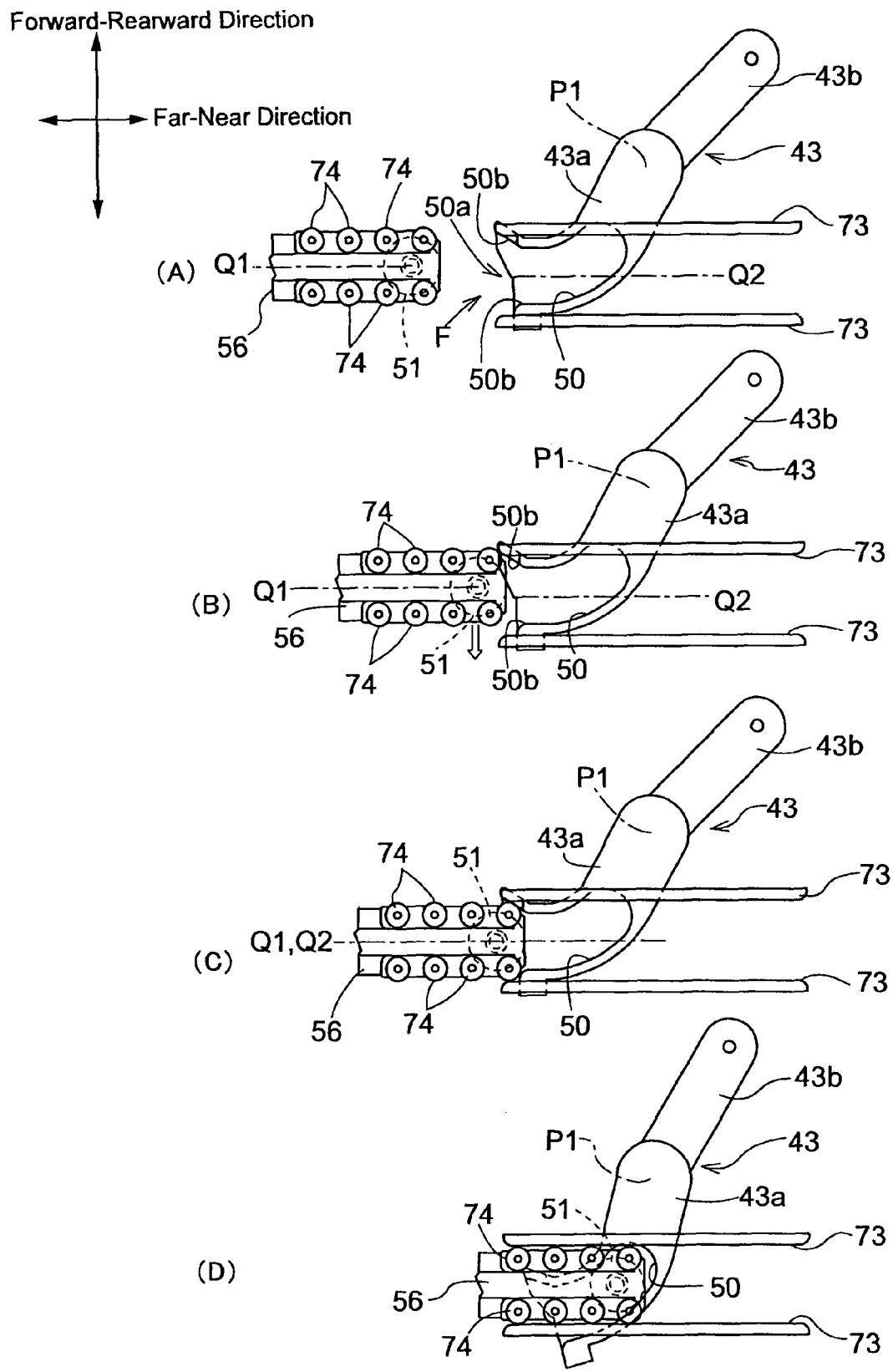
FIG. 17 is a view showing operating member guiding states of a guide device in a second embodiment.

Next, an article transport facility in the second embodiment will be described. The second embodiment shows a modification of the guide device F in the first embodiment described above. This guide device F will be described with reference to FIG. 17. The other aspects of the construction are the same as in the first embodiment, and will not be described again.

The guide device F includes linear guide members 73 arranged at both sides of the proper operative position in the fore and aft direction for guiding the engaging roller 51 to the proper operative position. As in the first embodiment, the proper operative position is set such that the center of engaging roller 51 coincides, in the fore and aft direction, with the center of the groove 50 of operated element 43 located in the proximate position.

The guide members 73 are arranged to guide the operating member 56 in the fore and aft direction by contacting guided rollers 74 arranged on the operating member 56 to be rotatable about vertical axes. The guided rollers 74 are arranged to protrude in the fore and aft direction from the operating member 56. The two guide members 73 are arranged to guide the operating member 56 to the proper operative position by guiding the operating member 56 in the fore and aft direction between the guide members 73. The guide members 73 have curved ends opposed to the transport vehicle 3 standing still in the article transfer location, for smoothly contacting and guiding the operating member 56 in the fore and aft direction.

The guide members 73 are elongated in the direction of access, for contacting the guided rollers 74 to guide the operating member 56 along the direction of access continuously after guiding the operating member 56 to pass through the space between the guide members 73 opposed in the fore and aft direction. In this way, the guide device F is constructed to guide the engaging roller 51 along the direction of access continuously, while the engaging roller 51 is located in the proper operative position in the fore and aft direction, after guiding the engaging roller 51 to the proper operative position.

Movements taking place when the operating device S executes the projecting operation and the guide device F guides the engaging roller 51 to the proper operative position will be described.

When the center Q1 of the engaging roller 51 is displaced from a proper operative position Q2, one of the guide members 73 contacts the guided rollers 74 to rotate the guided rollers 74. Consequently, the operating member 56 is guided between the two guide members 73 in the fore and aft direction, whereby the center Q1 of engaging roller 51 is brought into agreement with the proper operative position Q2. As in the first embodiment, when the guide surfaces 50b adjacent the opening 50a of the groove 50 contact the engaging roller 51 at this time, the guide surfaces 50b also guide the engaging roller 51 to bring the center Q1 of engaging roller 51 into agreement with the proper operative position Q2.

After guiding the operating member 56 to the position therebetween in the fore and aft direction, the two guide members 73 continue to contact the guided rollers 74. Consequently, after the engaging roller 51 is guided to the proper operative position in the fore and aft direction, the engaging roller is continuously guided along the direction of access while being located in the proper operative position.

Other Embodiments (1) In the first and second embodiments described hereinbefore, the operating device S is constructed the push-pull type for pushing the operated element 43 from the proximate position to the remote position with the engaging roller 51 engaging the groove 50, and pulling the operated element 43 from the remote position to the proximate position with the engaging roller 51 engaging the groove 50. The operating device S may be changed to any different type as appropriate.

For example, a biasing device such as a biasing spring may be provided for biasing the operated element 43 back to the proximate position, and the operating device S may be constructed the push type. Then, the operating device S executes a projecting operation to push the operated element 43 from the proximate position to the remote position with the engaging roller 51. In a retracting operation, the biasing device exerts a biasing force to return the operated element 43 from the remote position to the proximate position. The operating device S does not need to have an engaging roller 51 and may have a non-rotating abutting portion instead.

The operating device S does not have to have the engaging roller 51 and may have a non-rotating engaging portion instead.

(2) In the first and second embodiments described hereinbefore, the article support 29 in the article transfer position transfers a container 5 to and from the gripper 4 located in a position close to the upper position. For example, the article support 29 in the article transfer position may transfer a container 5 to and from the gripper 4 located in the upper position.

The position of the article support 29 for transferring a container 5 to and from the gripper 4 is not limited to the upper position or the position close to the upper position, but may be a position lower by a set height than the upper position. In this case, a container 5 may be transferred between the article support 29 and gripper 4 by lowering the gripper 4 by the set height from the upper position in the state of the article support 29 being located in the article transfer position.

(3) In the first and second embodiments described hereinbefore, a plurality of article supports 29 are arranged along the guide rail 2. The number of article supports 29 may be varied as appropriate. While the article supports 29 are installed at both sides of the guide rail 2, they may be installed only at one side of the guide rail 2.

(4) In the first and second embodiments described hereinbefore, the transport vehicle 3 has two operating devices S, i.e. the operating device S for shifting the article supports 29 arranged at the right-hand side in the direction of movement of the transport vehicle 3, and the operating device S for shifting the article supports 29 arranged at the left-hand side in the direction of movement of the transport vehicle 3. For example, the transport vehicle 3 may have one operating device S movable to project rightward and leftward from the transport vehicle 3, for shifting the article supports 29 arranged at both sides in the direction of movement of the transport vehicle 3

(5) In the first and second embodiments described hereinbefore, the mobile body is exemplified by the transport vehicle 3 having the gripper 4 capable of gripping a container 5 in suspension, and vertically movable relative to the transport vehicle 3. The construction for holding a container 5 may be varied as appropriate. For example, the transport vehicle may include only a gripper for holding a container 5 by pinching it at opposite sides thereof.

In this case, for example, article transfer stations are arranged at a side of and close to the guide rail 2. Each station has an article transfer device of the extension and retraction type for transfer of articles to and from the transport vehicles 3. In this way, articles may be transferred between the transport vehicle and the station.

(6) In the first and second embodiments described hereinbefore, the article transport facility transports, as articles, containers 5 storing semiconductor substrates. The articles transported may be varied as appropriate.

(7) The lock operating element does not need to include a roller and may include a non-rotating contact portion instead.

What is claimed is:

1. An article transport facility comprising:
    an article transporting mobile body configured to move along a path and having an article holder;
    an article support for storing an article, the article support being configured to be moved between an article transfer position for receiving an article from or delivering an article to the article holder of said article transporting mobile body that is at an article transfer location corresponding to said article support and an article storage position;
    operating means provided to said article transporting mobile body for moving said article support between said article storage position and said article transfer position, said operating means having an operating member, said operating means executing a projecting operation for projecting said operating member away from said article transporting mobile body at said article transfer location along a far-near direction that is transverse to the path, and a retracting operation for retracting said operating member toward said article transporting mobile body along the far-near direction, and said operating member being supported to be movable in a forward-rearward direction of said article transporting mobile body at said article transfer location that is parallel to the path;
    an operated element supported to be movable in said far-near direction between a proximate position closer to said article transporting mobile body at said article transfer location and a remote position further away from said article transporting mobile body at said article transfer location, said operated element being operable, in said proximate position, to cause said article support to be in said article storage position, and in said remote position, to cause said article support to be in said article transfer position;
    guide means for guiding said operating member in said forward-rearward direction to an operative position relative to said operated element when said operating means executes said projecting operation; and
    return biasing means for biasing said operating member in said forward-rearward direction toward a neutral position, in a state in which a guiding action of the guide means on the operating member is cancelled,
    wherein said operating means is configured to execute, when said article transporting mobile body is at said article transfer location, said projecting operation for causing said operating member to move said operated element from said proximate position to said remote position, and said retracting operation for causing, said operating member to move said operated element from said remote position to said proximate position.

2. An article transport facility as defined in claim 1, wherein
    said operated element is pivotable about a pivot axis to switch between said proximate position and said remote position, said operated element having a forward end thereof located closer than said pivot axis to said mobile body at said article transfer location when said operated element is in said proximate position;
    said operated element has a groove formed in the forward end thereof and extending toward said pivot axis in a direction transverse to said far-near direction when said operated element is in said proximate position, said groove is formed such that a forward end portion thereof, on a side located toward said mobile body at said article transfer location, extends along said far-near direction;
    said operating member is configured to engage and disengage said groove by moving along said far-near direction; and
    said operating means is configured to execute said projecting operation to engage said operating member with said groove and push said operated element from said proximate position to said remote position, and said retracting operation to allow said operated element to move from said remote position to said proximate position, and thereafter to disengage said operating member from said groove.

3. An article transport facility as defined in claim 2, wherein an opening portion of said groove has a pair of guide surfaces for guiding said operating member to said operative position, said pair of guide surfaces having a distance therebetween in the forward-rearward direction larger at an entrance than said operating member, and becoming the smaller with increasing distance from the mobile body.

4. An article transport facility as defined in claim 1, wherein said guide means includes guide members arranged at both sides in the forward-rearward direction of said operative position for guiding said operating member to said operative position.

5. An article transport facility as defined in claim 4, wherein said guide members are configured, after guiding said operating member to said operative position, to continue guiding said operating member along said far-near direction while maintaining said operating member in said operative position in said forward-rearward direction.

6. An article transport facility as defined in claim 4, wherein each of said guide members has a roller.

7. An article transport facility as defined in claim 1, wherein said path is defined by an overhead rail, said mobile body being a vehicle configured to move along said rail, said vehicle including a lift mechanism having a flexible member, and said article holder being configured to move vertically between an upper position and a lower position by said lift mechanism through said flexible member.

8. An article transport facility as defined in claim 7, wherein said vehicle includes a front vertical frame and a rear vertical frame with respect to a direction of movement thereof, said upper position being one in which said article holder is located between said front and rear frames, and said lower position being a position suited for placing an article on a ground station.

9. An article transport facility as defined in claim 8, wherein said article support is disposed substantially at a same vertical height as said article holder in said upper position, so that said article support can receive an article from said article holder by moving substantially horizontally to said article transfer position.

10. An article transport facility as defined in claim 9, wherein said article support is suspended from a ceiling through a fixed frame.

11. An article transport facility comprising:
a vehicle movable along an overhead rail;
a lift supported by said vehicle and having one or more flexible members;
an article gripper supported only by said vehicle through said flexible member and configured to be moved vertically relative to said vehicle, said article gripper being configured to grip an article from above;
an article support for storing an article, the article support being configured to be moved substantially horizontally between an article transfer position for receiving the article from said article gripper of said vehicle at an article transfer location relative to said article support or delivering the article to said article gripper and an article storage position;
an operated element provided to said article support to move said article support between said article transfer position and said article storage position, said operated element having a receiving portion;
an operating arm provided on said vehicle, said operating arm configured to be moved between a first position and a second position spaced from said first position in an extending direction, said operating arm including an operating portion for engaging said receiving portion of said operated element when in said second position, said operating portion being supported to the operating arm such that the operating portion is movable relative to said operating arm in response to a force applied to said operating portion in a direction substantially perpendicular to said extending direction, said operated element being operable by movement of said operating arm to said second position to move said article support to said article transfer position;
a guide provided to said article support for guiding said operating portion to said receiving portion of said operated element by contacting said operating portion of said operating arm to relatively move said operating portion in a direction substantially perpendicular to said extending direction; and
return biasing means for biasing said operating portion in a direction substantially perpendicular to said extending direction toward a neutral position, in a state in which a guiding action of the guide on the operating portion is cancelled.

12. An article transport facility as defined in claim 11, wherein
said receiving portion of said operated element has a receiving space; and
said operating portion has a roller, said receiving space of said operated element being defined by a pair of opposing surfaces arranged to contact said roller.

13. An article transport facility as defined in claim 11, wherein said vehicle includes a front vertical frame and a rear vertical frame with respect to a direction of movement thereof, said lift being constructed to move said gripper between an upper position between said front and rear frames, and a lower position for placing an article on a ground station.

14. An article transport facility as defined in claim 13, wherein said article transfer position of said article support is a position where said article support has advanced to a position in plan view between said front vertical frame and said rear vertical frame for receiving an article from said gripper.

15. An article transport facility as defined in claim 11, wherein
said article support is configured to be slidable between said article transfer position and said article storage position relative to a fixed frame by means of a guide mechanism;
said guide mechanism being arranged to incline with respect to a horizontal direction, whereby said article storage position is lower than said article transfer position, and whereby said article support is biased toward said article storage position by gravity.

16. An article transport facility as defined in claim 11, wherein said article support is suspended from a ceiling through a fixed frame.

17. An article transport facility as defined in claim 11, wherein said flexible member is one of a cable and a belt.

* * * * *